United States Patent
Tanaka et al.

(10) Patent No.: US 9,520,549 B2
(45) Date of Patent: Dec. 13, 2016

(54) PIEZOELECTRIC MATERIAL, PIEZOELECTRIC ELEMENT, AND ELECTRONIC APPARATUS

(71) Applicant: CANON KABUSHIKI KAISHA, Toyko (JP)

(72) Inventors: Hidenori Tanaka, Yokohama (JP); Shinya Koyama, Tokyo (JP); Jumpei Hayashi, Yokohama (JP); Hiroshi Saito, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 311 days.

(21) Appl. No.: 14/139,776

(22) Filed: Dec. 23, 2013

(65) Prior Publication Data
US 2014/0184876 A1   Jul. 3, 2014

(30) Foreign Application Priority Data
Dec. 28, 2012 (JP) ................. 2012-287242

(51) Int. Cl.
*H01L 41/187* (2006.01)
*B41J 2/14* (2006.01)
(Continued)

(52) U.S. Cl.
CPC ........ *H01L 41/1871* (2013.01); *B41J 2/14201* (2013.01); *B41J 2/14233* (2013.01);
(Continued)

(58) Field of Classification Search
CPC ...... H04N 5/2254; B41J 2202/03; G02B 7/08; H02N 2/163
(Continued)

(56) References Cited

U.S. PATENT DOCUMENTS

2013/0278681 A1* 10/2013 Saito ................... H01L 41/1871
347/68
2015/0053885 A1* 2/2015 Saito ................... B41J 2/14233
252/62.9 PZ
(Continued)

FOREIGN PATENT DOCUMENTS

CN   101333106 A   12/2008
CN   101834269 A    9/2010
(Continued)

OTHER PUBLICATIONS

Li Lu' Jiang Xiang-ping' Chen Chao' Yi Wen-bin' Tu Na' Li Xiao-hong, Study on Performances of (Ba0.85Ca0.15) (Ti1-xZrx)O3 Lead-free Piezoelectric Ceramics, Journal of Synthetic Crystals, Dec. 2012, vol. 41, No. 6, China Academic Journal Electronic Publishing House, China.
(Continued)

*Primary Examiner* — Thomas Dougherty
(74) *Attorney, Agent, or Firm* — Canon U.S.A. Inc., IP Division

(57) ABSTRACT

A piezoelectric material includes, as a main component, a perovskite-type metal oxide represented by a general formula $(Ba_{1-x}Ca_x)_a(Ti_{1-y-z}Sn_yZr_z)O_3$ where $1.00 \leq a \leq 1.01$, $0.125 \leq x \leq 0.300$, $0 \leq y \leq 0.020$, and $0.041 \leq z \leq 0.074$, the perovskite-type metal oxide containing copper (Cu) and manganese (Mn). A Cu content relative to 100 parts by weight of the metal oxide is 0.02 parts by weight or more and 0.60 parts by weight or less on a metal basis, and a Mn content relative to 100 parts by weight of the metal oxide is 0.12 parts by weight or more and 0.40 parts by weight or less on a metal basis.

29 Claims, 15 Drawing Sheets

(51) Int. Cl.
  *H04N 5/225* (2006.01)
  *H01L 41/43* (2013.01)
  *H01L 41/047* (2006.01)
  *H01L 41/083* (2006.01)
  *H01L 41/09* (2006.01)
  *H01L 41/257* (2013.01)
  *G02B 7/08* (2006.01)
  *H02N 2/16* (2006.01)

(52) U.S. Cl.
  CPC ........... *H01L 41/43* (2013.01); *H04N 5/2254* (2013.01); *B41J 2202/03* (2013.01); *G02B 7/08* (2013.01); *H01L 41/0477* (2013.01); *H01L 41/083* (2013.01); *H01L 41/0973* (2013.01); *H01L 41/257* (2013.01); *H02N 2/163* (2013.01)

(58) Field of Classification Search
  USPC ...... 310/311–371, 358; 252/69.2 R, 62.9 PZ, 252/62.9 R
  See application file for complete search history.

(56) References Cited

U.S. PATENT DOCUMENTS

2015/0295161 A1* 10/2015 Uebayashi ............. B32B 18/00
  347/68
2015/0304528 A1* 10/2015 Shimizu ............... H04N 5/2251
  348/374

FOREIGN PATENT DOCUMENTS

| JP | 2009-215111 A | 9/2009 | |
|----|---------------|--------|--|
| JP | 2010-120835 A | 6/2010 | |
| JP | WO2013/147107 A1 * | 10/2013 | ........... C04B 35/468 |

OTHER PUBLICATIONS

Wei Lin et al.; Phase Transition, Ferroelectric and Piezoelectric Properties of Ba1-xCaxTi1-yZryO3 Lead-Free Ceramics; Current Applied Physics, vol. 13, 2013, pp. 159-164.

* cited by examiner

PIEZOELECTRIC MATERIAL, PIEZOELECTRIC ELEMENT, AND ELECTRONIC APPARATUS

BACKGROUND OF THE INVENTION

Field of the Invention

The present invention relates to a piezoelectric material, and in particular, to a lead-free piezoelectric material. The present invention also relates to a piezoelectric element, a multilayered piezoelectric element, a liquid ejection head, a liquid ejection apparatus, an ultrasonic motor, an optical apparatus, a vibration apparatus, a dust removing device, an image pickup device, and an electronic apparatus, all of which use the piezoelectric material.

Description of the Related Art $ABO_3$ perovskite-type metal oxides such as lead zirconate titanate (hereinafter referred to as "PZT") are typically used as piezoelectric materials. However, since PZT contains lead as an A-site element, the effect of PZT on the environment has been regarded as a problem. Thus, piezoelectric materials that include lead-free perovskite-type metal oxides have been desired.

An example of a piezoelectric material that includes a lead-free perovskite-type metal oxide is barium titanate. In order to improve the properties of barium titanate, materials having a barium-titanate-based composition have been developed. Japanese Patent Laid-Open No. 2009-215111 discloses materials whose piezoelectric constants have been improved by adding Ca and Zr to barium titanate. However, these materials have phase transition temperatures at around room temperature, and thus the properties of these materials significantly vary depending on the environmental temperature. Thus, these materials are difficult to use in a wide temperature range. Furthermore, since these materials have a small mechanical quality factor, the materials may undergo depolarization when an alternating voltage is applied thereto.

Japanese Patent Laid-Open No. 2010-120835 discloses a material obtained by adding Ca and Cu to barium titanate. These materials have mechanical quality factors superior to that of barium titanate but have low piezoelectric properties.

The present invention provides a lead-free piezoelectric material that has a good, stable piezoelectric constant and a good, stable mechanical quality factor in a wide temperature range. Furthermore, the present invention provides a piezoelectric element, a multilayered piezoelectric element, a liquid ejection head, a liquid ejection apparatus, an ultrasonic motor, an optical apparatus, a vibration apparatus, a dust removing device, an image pickup device, and an electronic apparatus, all of which use the piezoelectric material.

SUMMARY OF THE INVENTION

A first aspect of the present invention provides a piezoelectric material including a perovskite-type metal oxide represented by general formula (1) as a main component, the perovskite-type metal oxide containing copper (Cu) and manganese (Mn):

$$(Ba_{1-x}Ca_x)_a(Ti_{1-y-z}Sn_yZr_z)O_3 \quad (1)$$

where $1.00 \leq a \leq 1.01$, $0.125 \leq x \leq 0.300$, $0 \leq y \leq 0.020$, and $0.041 \leq z \leq 0.074$. In the piezoelectric material, a Cu content relative to 100 parts by weight of the metal oxide is 0.02 parts by weight or more and 0.60 parts by weight or less on a metal basis, and a Mn content relative to 100 parts by weight of the metal oxide is 0.12 parts by weight or more and 0.40 parts by weight or less on a metal basis.

A second aspect of the present invention provides a piezoelectric element including a first electrode, a piezoelectric material portion, and a second electrode, in which the piezoelectric material portion contains the above piezoelectric material.

A third aspect of the present invention provides a multilayered piezoelectric element including piezoelectric material layers, and electrode layers including an internal electrode, in which the piezoelectric material layers and the electrode layers are alternately stacked, and the piezoelectric material layers are composed of the above piezoelectric material.

A fourth aspect of the present invention provides a liquid ejection head including a liquid chamber including a vibration unit that includes the above piezoelectric element or the above multilayered piezoelectric element, and an ejection port in communication with the liquid chamber.

A fifth aspect of the present invention provides a liquid ejection apparatus including a placing unit of a transfer member, and the above liquid ejection head.

A sixth aspect of the present invention provides an ultrasonic motor including a vibrating member that includes the above piezoelectric element or the above multilayered piezoelectric element, and a moving member that contacts the vibrating member.

A seventh aspect of the present invention provides an optical apparatus including a driving unit including the above ultrasonic motor.

An eighth aspect of the present invention provides a vibration apparatus including a vibrating member including a diaphragm, and the above piezoelectric element or multilayered piezoelectric element disposed on the diaphragm.

A ninth aspect of the present invention provides a dust removing device including a vibration unit including the above vibration apparatus.

A tenth aspect of the present invention provides an image pickup device including the above dust removing device, and an image pickup element unit, in which a diaphragm of the dust removing device is disposed on a light-receiving surface side of the image pickup element unit.

An eleventh aspect of the present invention provides an electronic apparatus including a piezoelectric acoustic component including the above piezoelectric element or the above multilayered piezoelectric element.

Further features of the present invention will become apparent from the following description of exemplary embodiments with reference to the attached drawings.

DESCRIPTION OF THE EMBODIMENTS

Figure 1:
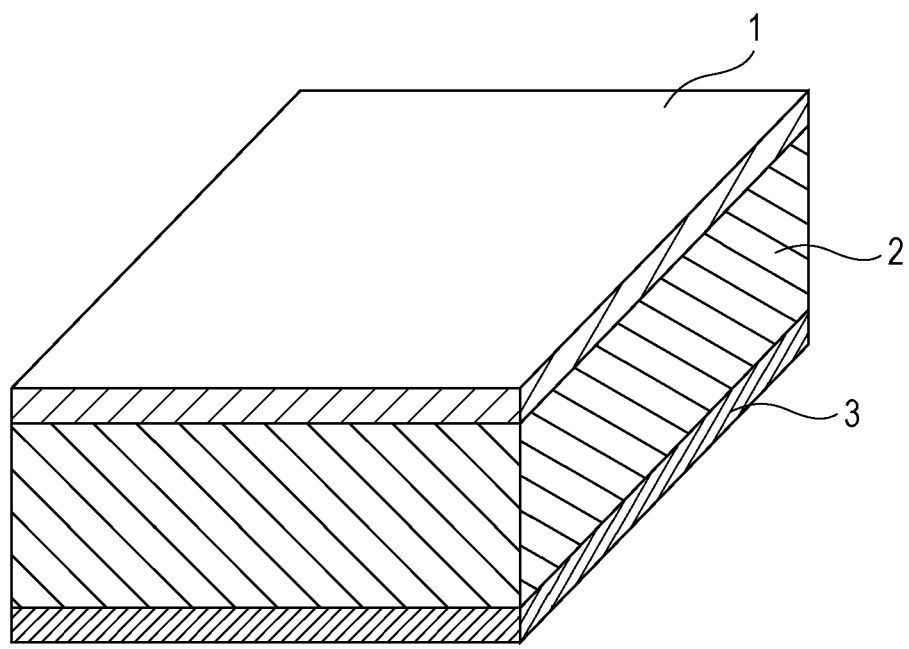
FIG. 1 is a schematic view showing a structure of a piezoelectric element according to an embodiment of the present invention.

Embodiments of the present invention will now be described. A piezoelectric material according to an embodiment of the present invention includes a perovskite-type metal oxide represented by general formula (1) as a main component, copper (Cu) contained in the metal oxide, and manganese (Mn) contained in the metal oxide.

$$(Ba_{1-x}Ca_x)_a(Ti_{1-y-z}Sn_yZr_z)O_3 \quad (1)$$

($1.00 \leq a \leq 1.01$, $0.125 \leq x \leq 0.300$, $0 \leq y \leq 0.020$, and $0.041 \leq z \leq 0.074$) In the piezoelectric material, a Cu content relative to 100 parts by weight of the metal oxide is 0.02 parts by weight or more and 0.60 parts by weight or less on a metal basis, and a Mn content relative to 100 parts by weight of the metal oxide is 0.12 parts by weight or more and 0.40 parts by weight or less on a metal basis.

Perovskite-Type Metal Oxide

In the present invention, the term "perovskite-type metal oxide" refers to a metal oxide having a perovskite structure which is ideally a cubic crystal structure as described in Iwanami Rikagaku Jiten (Iwanami dictionary of physics and chemistry), 5th edition (Iwanami Shoten, Publishers, published Feb. 20, 1998). A metal oxide having a perovskite structure is usually represented by a chemical formula of $ABO_3$. In a perovskite-type metal oxide, element A and element B are present in the form of ions and occupy particular positions in a unit cell called A sites and B sites, respectively. For example, in a unit cell of a cubic crystal system, element A is located at vertices of the cube and element B is located at the body-centered position of the cube. Element oxygen (O) is present in the form of an anion of oxygen and occupies face-centered positions of the cube.

In the metal oxide represented by general formula (1), metal elements that are located at the A sites are barium (Ba) and calcium (Ca), and metal elements that are located at the B sites are titanium (Ti), tin (Sn), and zirconium (Zr). Note that some of the Ba and Ca atoms may be located at the B sites. Similarly, some of the Ti and Zr atoms may be located at the A sites. However, it is not preferable that Sn atoms be present at the A sites from the viewpoint that the piezoelectric property decreases.

In general formula (1), the molar ratio of a B-site element to oxygen (O) is 1:3. However, even when the molar ratio of the amount of B-site element to the amount of oxygen (O) is slightly deviated therefrom (for example, 1.00:2.94 to 1.00:3.06), a metal oxide having such a molar ratio is also included in the scope of the present invention as long as the metal oxide has a perovskite structure as a primary phase.

Whether the metal oxide has a perovskite structure or not can be determined by structural analysis by X-ray diffraction or electron beam diffraction, for example.

The form of the piezoelectric material according to an embodiment of the present invention is not limited, and may be any of a ceramic, powder, single crystal, film, slurry, or the like. However, the form of the piezoelectric material is preferably a ceramic. In this description, the term "ceramic" refers to an aggregate (also referred to as bulk) of crystal grains that are composed of a metal oxide serving as a basic component, and that are sintered by heat treatment, that is, a so-called polycrystal. The term "ceramic" also refers to a ceramic that has been processed after sintering.

Main Component of Piezoelectric Material

According to the piezoelectric material according to an embodiment of the present invention, in general formula (1), a, which represents the ratio of the total molar amount of Ba and Ca in A sites to the total molar amount of Ti, Zr, and Sn in B sites, is in the range of $1.00 \leq a \leq 1.01$. When a is smaller than 1.00, abnormal grain growth easily occurs and the mechanical strength of the material is decreased. When a is greater than 1.01, the temperature necessary for grain growth becomes excessively high and sintering cannot be performed in a common firing furnace. Herein, the phrase "sintering cannot be performed" refers to a state in which the density is not increased to a sufficiently high value, or a large number of pores and defects are present in the piezoelectric material.

In general formula (1), x, which represents the molar ratio of Ca in A sites, is in the range of $0.125 \leq x \leq 0.300$. When x is smaller than 0.125, structural phase transition occurs at an operating temperature, which may adversely affect the durability. When x is greater than 0.300, the piezoelectric property may not be sufficient. More preferably, x is in the range of $0.125 \leq x \leq 0.220$.

In general formula (1), y, which represents the molar ratio of Sn in B sites, is in the range of $0 \leq y \leq 0.020$. When y is greater than 0.020, the Curie temperature ($T_C$) becomes low, specifically, lower than 100° C. and the piezoelectric property is lost at high temperatures. More preferably, y is in the range of $0.005 \leq y \leq 0.020$.

In general formula (1), z, which represents the molar ratio of Zr in B sites, is in the range of $0.041 \leq z \leq 0.074$. When z is smaller than 0.041, the piezoelectric property may not be sufficient. When z is greater than 0.074, the Curie temperature ($T_C$) becomes low, specifically, lower than 100° C. and the piezoelectric property is lost at high temperatures. In view of the durability at high temperatures, z is more preferably in the range of $0.041 \leq z \leq 0.054$.

In this description, the term "Curie temperature ($T_C$)" refers to a temperature at which ferroelectricity of a material is lost. In general, the piezoelectric property of a piezoelectric material is also lost at the Curie temperature ($T_C$) or higher. Examples of the method for detecting the Curie temperature ($T_C$) include a method of directly measuring the temperature at which ferroelectricity is lost while varying the measurement temperature and a method of measuring the relative dielectric constant under application of a very small AC electric field while varying the measurement temperature, and determining a temperature at which the relative dielectric constant is maximal.

The method for determining the composition of the piezoelectric material according to an embodiment of the present invention is not particularly limited. Examples of the method include X-ray fluorescence analysis (XRF), inductively coupled plasma (ICP) atomic emission spectroscopy and atomic absorption spectroscopy. The weight ratio and the composition ratio of the elements contained in the piezoelectric material can be determined by any of these methods.

In the piezoelectric material according to an embodiment of the present invention, a copper (Cu) content relative to 100 parts by weight of the metal oxide is 0.02 parts by weight or more and 0.60 parts by weight or less on a metal basis. The piezoelectric material according to an embodiment of the present invention having a Cu content within this range exhibits an improved insulation property and an improved piezoelectric property.

Herein, the term "on a metal basis" with respect to the Cu content refers to a value determined as follows. Among the contents of metals, namely, Ba, Ca, Ti, Zr, Sn, and Cu measured by XRF, ICP atomic emission spectroscopy, atomic absorption spectroscopy, or the like, the contents of elements contained in the metal oxide represented by general formula (1) are converted to an amount on an oxide basis. Subsequently, the proportion of the weight of copper metal when the total weight of the amount calculated on an oxide basis is assumed to be 100 is determined. When the Cu content is less than 0.02 parts by weight, the insulation property decreases. When the Cu content exceeds 0.60 parts by weight, the piezoelectric property decreases. The Cu content is more preferably 0.10 parts by weight or more and 0.40 parts by weight or less on a metal basis relative to 100 parts by weight of the metal oxide represented by general formula (1). The form of copper is not limited to metallic Cu as long as copper is contained as a Cu component in the piezoelectric material. For example, copper may be dissolved in B sites of a perovskite structure or may be included in grain boundaries. Alternatively, a Cu component may be contained in the piezoelectric material in the form of a metal, ion, oxide, metal salt, complex, or the like.

In the piezoelectric material according to an embodiment of the present invention, Mn is contained in the metal oxide. A manganese (Mn) content is 0.12 parts by weight or more and 0.40 parts by weight or less on a metal basis relative to 100 parts by weight of the metal oxide. The piezoelectric material according to an embodiment of the present invention having a Mn content within this range exhibits an improved insulation property and an improved mechanical quality factor. Here, the term "mechanical quality factor" refers to a factor that indicates an elastic loss caused by oscillation when the piezoelectric material is evaluated as an oscillator. The magnitude of the mechanical quality factor is observed as a sharpness of a resonance curve in an impedance measurement. That is, the mechanical quality factor is a factor that indicates the sharpness of the resonance of an oscillator. The improvement of the insulation property and the mechanical quality factor ensures long-term reliability of a piezoelectric element when the piezoelectric element is produced by using the piezoelectric material and driven by applying a voltage. When the piezoelectric material according to an embodiment of the present invention has contents of Cu and Mn that satisfy the above ranges, a synergistic effect is obtained. Specifically, the insulation property, the piezoelectric property, and the mechanical quality factor are improved.

When the Mn content is less than 0.12 parts by weight, the mechanical quality factor is decreased to less than 400. A small mechanical quality factor significantly increases the power consumption when a piezoelectric element produced by using the piezoelectric material is driven as a resonance device. The mechanical quality factor of a piezoelectric material used in a resonance device is preferably 800 or more, and more preferably 1,000 or more. When the mechanical quality factor is within this range, a significant increase in the power consumption does not occur in practical operation. When the Mn content exceeds 0.40 parts by weight, the piezoelectric property is significantly decreased due to a factor such as the emergence of crystals having a hexagonal structure that do not contribute to the piezoelectric property. The Mn content is more preferably 0.18 parts by weight or more and 0.30 parts by weight or less on a metal basis relative to 100 parts by weight of the metal oxide represented by general formula (1). Manganese (Mn) may occupy B sites. When Mn is dissolved in B sites, a preferable range of a ratio A/B is $0.993 \leq A/B \leq 0.998$, where A is the molar amount of Ba and Ca in A sites and B is the molar amount of Ti, Zr, Sn, and Mn in B sites. A piezoelectric material having a ratio A/B within this range has a particularly high piezoelectric constant and a particularly high mechanical quality factor, and thus a device having high durability can be produced by using the piezoelectric material according to an embodiment of the present invention.

The valence of Mn is preferably 4+. In general, Mn can take a valence of 4+, 2+, and 3+. This is because in the case where conduction electrons are present in crystals (for example, in the case where oxygen defects are present in crystals or in the case where a donor element occupies A sites), the valence of Mn is decreased from 4+ to, for example, 3+ or 2+, thereby trapping the conduction electrons to improve the insulation resistance. In view of the ionic radius, the valence of Mn is preferably 4+ because Ti, which is a main component of B sites, can be easily substituted with Mn.

When the valence of Mn is lower than 4+, for example, 2+, Mn functions as an acceptor. When Mn is present as an acceptor in a perovskite-structure crystal, a hole is generated in the crystal or an oxygen hole is formed in the crystal.

When a large number of Mn atoms added have a valence of 2+ or 3+, holes cannot be completely compensated for only by the introduction of oxygen holes, resulting in a decrease in the insulation resistance. Accordingly, most of the Mn atoms preferably have a valence of 4+. However, a very small amount of Mn may have a valence lower than 4+, occupy, as an acceptor, B sites of the perovskite structure, and form oxygen holes. This is because Mn having a valence of 2+ or 3+ and an oxygen hole form a defect dipole, and thus the mechanical quality factor of the piezoelectric material can be improved.

The piezoelectric material according to an embodiment of the present invention preferably satisfies the relationship $y+z \leq (11x/14) - 0.037$ in general formula (1). The piezoelectric material according to an embodiment of the present invention is advantageous in that the variation width of the properties with respect to the temperature change becomes small in the range that satisfies $y+z \leq (11x/14)-0.037$. On the other hand, in the range of $y+z>(11x/14)-0.037$, the piezoelectric material may have a phase transition temperature in the range of −25° C. to 100° C. and thus stability of the piezoelectric property in a range of a device operating temperature may be impaired.

Generally known barium titanate has a transition temperature at which its crystal structure is transformed from an orthorhombic crystal to a tetragonal crystal (hereinafter referred to as $T_{ot}$) of about 17° C. and a transition temperature at which its crystal structure is transformed from a tetragonal crystal to an orthorhombic crystal (hereinafter referred to as $T_{to}$) of about 5° C. These transition temperatures of the crystal structure are referred to as "structural phase transition temperatures". When the temperature of a piezoelectric material repeatedly passes through the range between these structural phase transition temperatures by a change in the ambient temperature, the volume of a unit cell and the direction of the polarization axis repeatedly change. Consequently, depolarization may gradually occur, and the piezoelectric property may be degraded. For this reason, it is difficult to use barium titanate in a wide temperature range. In contrast, since the piezoelectric material according to an embodiment of the present invention has a $T_{ot}$ of lower than −25° C., the piezoelectric material does not have the above problem. Furthermore, the piezoelectric material according to an embodiment of the present invention has a Curie temperature ($T_C$) at which the crystal structure is transformed from a tetragonal crystal to a cubic crystal of higher than 100° C. Therefore, even in a severe environment at 80° C., which is assumed to be a typical temperature in a car in the summer, the piezoelectric property can be maintained. Furthermore, since the piezoelectric material according to an embodiment of the present invention maintains the tetragonal crystal structure in the range of −25° C. to 100° C., a high mechanical quality factor can be maintained. In addition, since the use of the orthorhombic crystal region where the mechanical quality factor is relatively small can be avoided, the piezoelectric material according to an embodiment of the present invention can have a good, stable piezoelectric constant and a good, stable mechanical quality factor in a wide operating temperature range.

In the piezoelectric material according to an embodiment of the present invention, in general formula (1), the molar ratio z of Zr and the molar ratio y of Sn in B sites more preferably satisfy a relational expression $z \leq -2y+0.100$. In the range of $z>-2y+0.100$, the Curie temperature ($T_C$) is decreased to lower than 105° C., and thus the piezoelectric property may be decreased at high temperatures.

Density

The piezoelectric material according to an embodiment of the present invention preferably has a relative density of 93% or more and 100% or less.

When the relative density is lower than 93%, the piezoelectric property and mechanical quality factor may not be satisfactory and the mechanical strength may be decreased.

The term "relative density" refers to a ratio of an actually measured density to a theoretical density calculated from lattice constants of the piezoelectric material and the atomic weights of elements constituting the piezoelectric material. The lattice constants can be measured by, for example, X-ray diffractometry. The density can be measured by, for example, the Archimedes method.

Production Method

The method for producing the piezoelectric material according to an embodiment of the present invention is not particularly limited.

Raw Material

In the production of a piezoelectric material, solid powders such as oxides, carbonates, nitrates, and oxalates that contain constituent elements may be sintered at a normal pressure, which is a typical process. The raw materials are metal compounds such as a Ba compound, a Ca compound, a Ti compound, a Sn compound, a Zr compound, a Cu compound, and a Mn compound.

Examples of the Ba compound that can be used include barium oxide, barium carbonate, barium oxalate, barium acetate, barium nitrate, barium titanate, barium zirconate, and barium zirconate titanate.

Examples of the Ca compound that can be used include calcium oxide, calcium carbonate, calcium oxalate, calcium acetate, calcium titanate, calcium zirconate, and calcium zirconate titanate.

Examples of the Ti compound that can be used include titanium oxide, barium titanate, barium zirconate titanate, and calcium titanate.

Examples of the Sn compound that can be used include tin oxide, barium stannate, barium stannate titanate, and calcium stannate.

Examples of the Zr compound that can be used include zirconium oxide, barium zirconate, barium zirconate titanate, and calcium zirconate.

Examples of the Cu compound that can be used include copper(I) oxide, copper(II) oxide, copper carbonate, copper (II) acetate, and copper oxalate.

Examples of the Mn compound that can be used include manganese carbonate, manganese oxide, manganese dioxide, manganese acetate, and trimanganese tetraoxide.

The raw materials for adjusting the molar ratio a, that is, the ratio of the molar amount of Ba and Ca in A sites to the molar amount of Ti, Sn, and Zr in B sites of the piezoelectric material according to an embodiment of the present invention are not particularly limited. Any of a Ba compound, a Ca compound, a Ti compound, a Sn compound, and a Zr compound can achieve the same effect.

Granulated Powder

The method for granulating raw material powders of the piezoelectric material is not particularly limited. From the viewpoint that the grain diameter of the resulting granulated powder can be made more uniform, a spray dry method is most preferably employed.

Examples of a binder that can be used in granulation include polyvinyl alcohol (PVA), polyvinyl butyral (PVB), and acrylic resins. The amount of binder added is preferably 1 to 10 parts by weight relative to the amount of raw material powders of the piezoelectric material. The amount of binder added is more preferably 2 to 5 parts by weight from the viewpoint of increasing the density of a compact.

Sintering

The method for sintering a piezoelectric material according to an embodiment of the present invention is not particularly limited.

Examples of the sintering method include sintering with an electric furnace, sintering with a gas furnace, an electric heating method, a microwave sintering method, a millimeter wave sintering method, and hot isostatic pressing (HIP). Sintering with an electric furnace or gas may be conducted in a continuous furnace or a batch furnace.

The sintering temperature of the piezoelectric material in the sintering method described above is not particularly limited. The sintering temperature may be a temperature at which the compounds react with each other and crystal growth sufficiently occurs. The sintering temperature is preferably 1,200° C. or higher and 1,550° C. or lower and more preferably 1,300° C. or higher and 1,480° C. or lower from the viewpoint of controlling the grain diameter of the piezoelectric material to be in the range of 1.5 to 10 μm. A piezoelectric material sintered within the above temperature range exhibits a good piezoelectric property. In the present invention, the term "grain diameter" refers to a "projected area equivalent circular diameter" which is generally known in microscopy, and represents the diameter of a perfect circle having the same area as the projected area of a crystal grain. In the present invention, the method for measuring this grain diameter is not particularly limited. For example, the grain diameter may be determined by obtaining a photograph image of a surface of a piezoelectric material with a polarizing microscope or a scanning electron microscope, and then processing the image. Since the optimum magnification differs depending on the grain diameter to be analyzed, an optical microscope and an electron microscope may be properly used. Alternatively, the equivalent circular diameter may be determined from an image of a polished surface or a cross section instead of a surface of the material.

In order to stabilize the properties of the piezoelectric material obtained by a sintering process with high reproducibility, the sintering process may be conducted for 2 to 24 hours while the sintering temperature is kept constant within the above range. For example, a two-step sintering method may be employed. However, a method that does not include rapid temperature changes is preferably employed in view of productivity.

After the piezoelectric material is polished, the piezoelectric material may be heat-treated at a temperature of 1,000° C. or higher. When a piezoelectric material is mechanically polished, a residual stress is generated inside the piezoelectric material. This residual stress can be relaxed by the heat treatment at 1,000° C. or higher and the piezoelectric property of the piezoelectric material can be further improved. This heat treatment also has an effect of eliminating raw material powders, such as barium carbonate, precipitated in grain boundary portions. The time of the heat treatment is not particularly limited but may be one hour or longer.

Piezoelectric Element

A piezoelectric element according to an embodiment of the present invention will be described.

FIG. 1 is a schematic view showing a structure of a piezoelectric element according to an embodiment of the present invention. The piezoelectric element includes at least a first electrode 1, a piezoelectric material 2, and a second electrode 3, and the piezoelectric material 2 is the piezoelectric material according to an embodiment of the present invention.

The piezoelectric material according to an embodiment of the present invention may be formed into a piezoelectric element that includes at least a first electrode and a second electrode. The piezoelectric property of the piezoelectric material can be evaluated by using the piezoelectric element. Each of the first electrode and the second electrode is constituted by an electrically conductive layer having a thickness of about 5 to 2,000 nm. The material of the electrodes is not particularly limited, and may be any material that is commonly used in piezoelectric elements. Examples thereof include metals such as Ti, Pt, Ta, Ir, Sr, In, Sn, Au, Al, Fe, Cr, Ni, Pd, Ag, and Cu and compounds thereof.

Each of the first and second electrodes may be composed of one of these materials or may have a multilayered structure prepared by stacking two or more of these materials. The first and second electrodes may be composed of materials different from each other.

The method for forming the first and second electrodes is not particularly limited. For example, the first and second electrodes may be formed by baking a metal paste or by sputtering, vapor deposition, or the like. The first and second electrodes may be patterned to have a desired shape.

Polarization

The piezoelectric element may have polarization axes oriented in a particular direction. When polarization axes are oriented in a particular direction, the piezoelectric constant of the piezoelectric element is increased.

The polarization method for the piezoelectric element is not particularly limited. A polarization treatment may be conducted in air or in silicone oil. The temperature during polarization is preferably 60° C. to 150° C. However, optimum conditions slightly vary depending on the composition of the piezoelectric material that constitutes the device. The electric field applied for conducting the polarization treatment is preferably 600 V/mm to 2.0 kV/mm.

Resonance-Antiresonance Method

The piezoelectric constant and the mechanical quality factor of the piezoelectric element can be calculated from the results of a resonance frequency and an antiresonance frequency measured with a commercially available impedance analyzer on the basis of Japan Electronics and Information Technology Industries Association Standard (JEITA EM-4501). This method is hereinafter referred to as a "resonance-antiresonance method".

Multilayered Piezoelectric Element

A multilayered piezoelectric element according to an embodiment of the present invention will be described.

A multilayered piezoelectric element according to an embodiment of the present invention includes piezoelectric material layers and electrode layers including an internal electrode. In the multilayered piezoelectric element, the piezoelectric material layers and the electrode layers are alternately stacked, and the piezoelectric material layers are composed of the piezoelectric material according to an embodiment of the present invention.

Figure 2A:
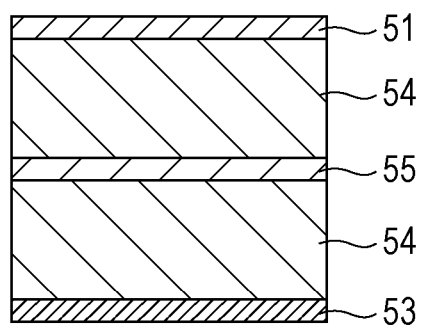
FIGS. 2A and 2B are each a schematic cross-sectional view showing a structure of a multilayered piezoelectric element according to an embodiment of the present invention.

FIG. 2A is a schematic cross-sectional view showing a structure of a multilayered piezoelectric element according to an embodiment of the present invention. The multilayered piezoelectric element according to an embodiment of the present invention includes piezoelectric material layers 54 and electrode layers including an internal electrode 55. The piezoelectric material layers and the electrode layers are alternately stacked, and the piezoelectric material layers 54 are composed of the piezoelectric material described above. The electrode layers may include external electrodes such as a first electrode 51 and a second electrode 53 besides the internal electrode 55.

Figure 2B:
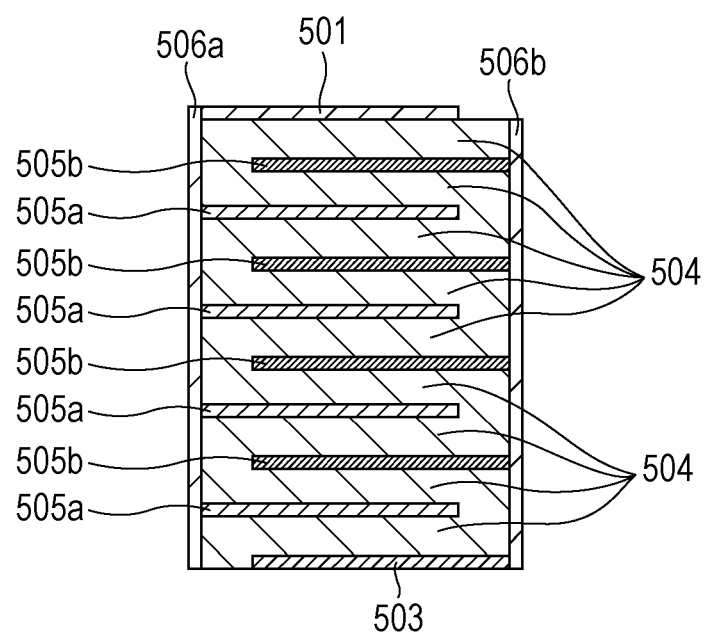

FIG. 2A shows a structure of a multilayered piezoelectric element according to an embodiment of the present invention which includes two piezoelectric material layers 54 and one internal electrode 55 alternately stacked and in which the resulting stacked body is sandwiched between the first electrode 51 and the second electrode 53. Alternatively, as shown in FIG. 2B, the number of the piezoelectric material layers and the number of the internal electrodes may be increased, and the numbers are not particularly limited. A multilayered piezoelectric element shown in FIG. 2B includes nine piezoelectric material layers 504 and eight internal electrodes 505 that are alternately stacked. The resulting stacked body is sandwiched between a first electrode 501 and a second electrode 503. The multilayered piezoelectric element further includes an external electrode 506a and an external electrode 506b for short-circuiting the internal electrodes that are alternately formed.

The size and the shape of the internal electrodes 55 and 505 and external electrodes 506a and 506b are not necessarily the same as those of the piezoelectric material layers 54 and 504. The internal electrodes 55 and 505 and external electrodes 506a and 506b may be divided into a plurality of portions. Each of the internal electrodes 55 and 505 and the external electrodes 506a and 506b is constituted by a conductive layer having a thickness of about 5 to 2,000 nm.

The internal electrodes 55 and 505 preferably contain Ag and Pd, and a weight ratio M1/M2 of a Ag content M1 by weight to a Pd content M2 by weight preferably satisfies the relationship $0.25 \leq M1/M2 \leq 4.0$. When the weight ratio M1/M2 is less than 0.25, the sintering temperature of the internal electrodes becomes high. When the weight ratio M1/M2 exceeds 4.0, the internal electrodes have an island shape and become uneven in the plane. The weight ratio M1/M2 is more preferably $0.3 \leq M1/M2 \leq 3.0$.

In view of the low cost of the electrode material, the internal electrodes 55 and 505 may contain at least one of Ni and Cu. When the internal electrodes 55 and 505 contain at least one of Ni and Cu, the multilayered piezoelectric element according to an embodiment of the present invention may be fired in a reducing atmosphere.

The material of the external electrodes 506a and 506b is not particularly limited and any material that is usually used in piezoelectric elements can be used. Examples thereof include metals such as Ti, Pt, Ta, Ir, Sr, In, Sn, Au, Al, Fe, Cr, Ni, Pd, Ag, and Cu and compounds thereof. Each of the external electrodes may be composed of one of these materials or a mixture or an alloy of two or more of these materials, or may have a multilayered structure prepared by stacking two or more of these materials. The plurality of electrodes may be composed of materials different from each other.

As shown in FIG. 2B, the electrode layers including the internal electrodes 505 may be short-circuited from each other so as to match the phase of the driving voltage. For example, the internal electrodes 505a and the first electrode 501 may be short-circuited through the external electrode 506a. The internal electrodes 505b and the second electrode 503 may be short-circuited through the external electrode 506b. The internal electrodes 505a and the internal electrodes 505b may be alternately arranged. The form of short-circuiting between the electrode layers is not particularly limited. Electrodes or wires for short-circuiting may be provided on side surfaces of a multilayered piezoelectric element. Alternatively, a through hole penetrating the piezoelectric material layers 504 may be provided and the inside thereof may be filled with a conductive material so as to short-circuit the electrode layers.

Liquid Ejection Head

Next, a liquid ejection head according to an embodiment of the present invention will be described.

A liquid ejection head according to an embodiment of the present invention includes at least a liquid chamber including a vibration unit that includes the piezoelectric element or the multilayered piezoelectric element described above, and an ejection port in communication with the liquid chamber.

Figure 3A:
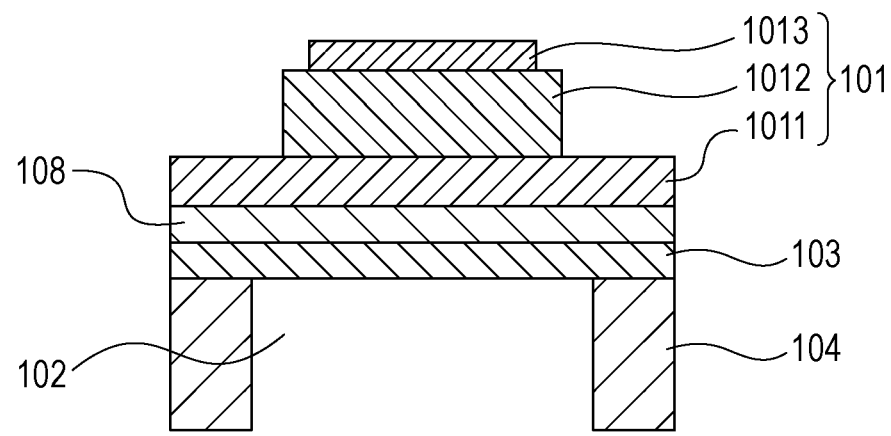
FIGS. 3A and 3B are each a schematic view showing a structure of a liquid ejection head according to an embodiment of the present invention.
Figure 3B:
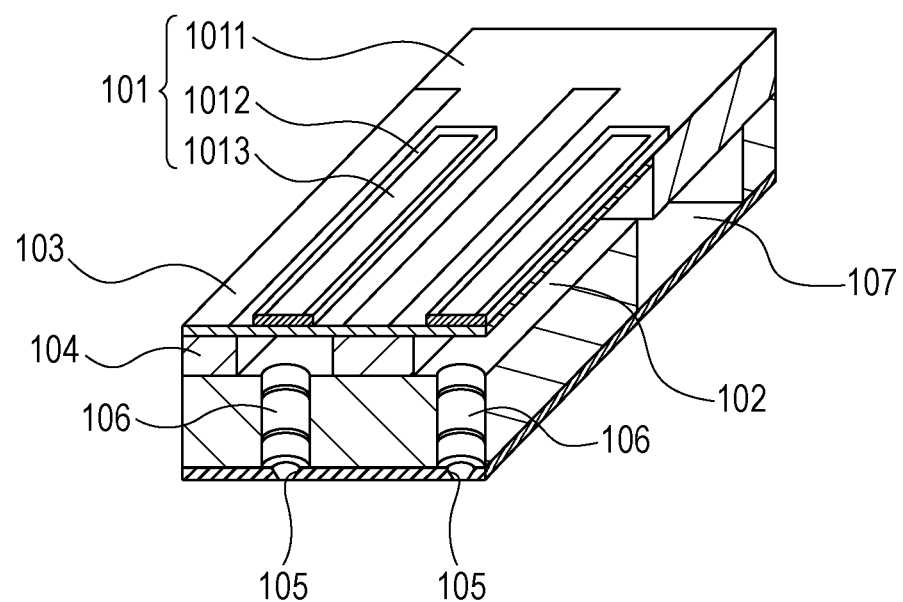

FIGS. 3A and 3B are each a schematic view showing a structure of a liquid ejection head according to an embodiment of the present invention. As shown in FIGS. 3A and 3B, the liquid ejection head according to an embodiment of the present invention includes a piezoelectric element 101 according to an embodiment of the present invention. The piezoelectric element 101 includes at least a first electrode 1011, a piezoelectric material 1012, and a second electrode 1013. As shown in FIG. 3B, the piezoelectric material 1012 is patterned as required.

FIG. 3B is a schematic view of the liquid ejection head. The liquid ejection head includes ejection ports 105, individual liquid chambers 102, communicating holes 106 that connect the individual liquid chambers 102 to the ejection ports 105, liquid chamber partitions 104, a common liquid chamber 107, a diaphragm 103, and the piezoelectric element 101. Although the piezoelectric element 101 has a rectangular shape in the drawing, the piezoelectric element 101 may have any shape other than a rectangular shape, such as an elliptical shape, a circular shape, or a parallelogram shape. In general, the piezoelectric material 1012 has a shape conforming to the shape of the individual liquid chamber 102.

A nearby portion of the piezoelectric element 101 included in the liquid ejection head according to an embodiment of the present invention will now be described in detail with reference to FIG. 3A. FIG. 3A is a cross-sectional view of the piezoelectric element shown in FIG. 3B taken in the width direction. Although the cross-sectional shape of the piezoelectric element 101 is a rectangle in the drawing, the cross-sectional shape may be a trapezoidal shape, an inverted trapezoidal shape, or the like.

In the drawing, the first electrode 1011 is used as a lower electrode and the second electrode 1013 is used as an upper electrode. However, the arrangement of the first electrode 1011 and the second electrode 1013 is not limited thereto. For example, the first electrode 1011 may be used as the lower electrode or the upper electrode. Similarly, the second electrode 1013 may be used as the upper electrode or the lower electrode. A buffer layer 108 may be present between the diaphragm 103 and the lower electrode. Note that these differences in the names are derived from the method for producing a device, and advantages of the present invention can be achieved in either case.

In the liquid ejection head, the diaphragm 103 moves in vertical directions due to expansion and contraction of the piezoelectric material 1012 and applies pressure to a liquid in the individual liquid chambers 102. As a result, the liquid is ejected from the ejection ports 105. The liquid ejection head according to an embodiment of the present invention can be used in printers and in the production of electronic devices.

The thickness of the diaphragm 103 is 1.0 µm or more and 15 µm or less and preferably 1.5 µm or more and 8 µm or less. The material of the diaphragm 103 is not particularly limited but may be silicon (Si). Silicon constituting the diaphragm 103 may be doped with boron or phosphorus. The buffer layer 108 on the diaphragm 103 and an electrode layer on the buffer layer 108 may constitute part of the diaphragm 103. The thickness of the buffer layer 108 is 5 nm or more and 300 nm or less and preferably 10 nm or more and 200 nm or less. The size of each of the ejection ports 105 is 5 µm or more and 40 µm or less in terms of equivalent circular diameter. The shape of the ejection port 105 may be circular, star-shaped, rectangular, triangular, or the like.

Liquid Ejection Apparatus

A liquid ejection apparatus according to an embodiment of the present invention will now be described. A liquid ejection apparatus according to an embodiment of the present invention includes a placing unit of a transfer member and the liquid ejection head described above.

Figure 4:
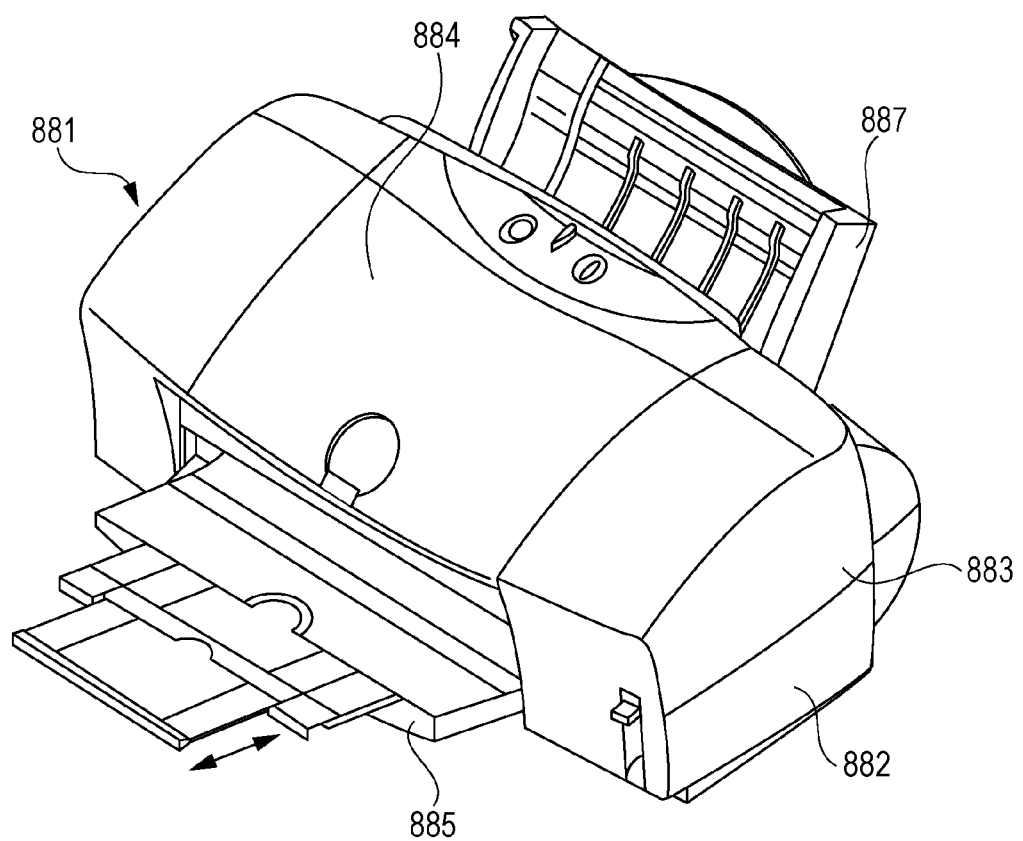
FIG. 4 is a schematic view showing a liquid ejection apparatus according to an embodiment of the present invention.
Figure 5:
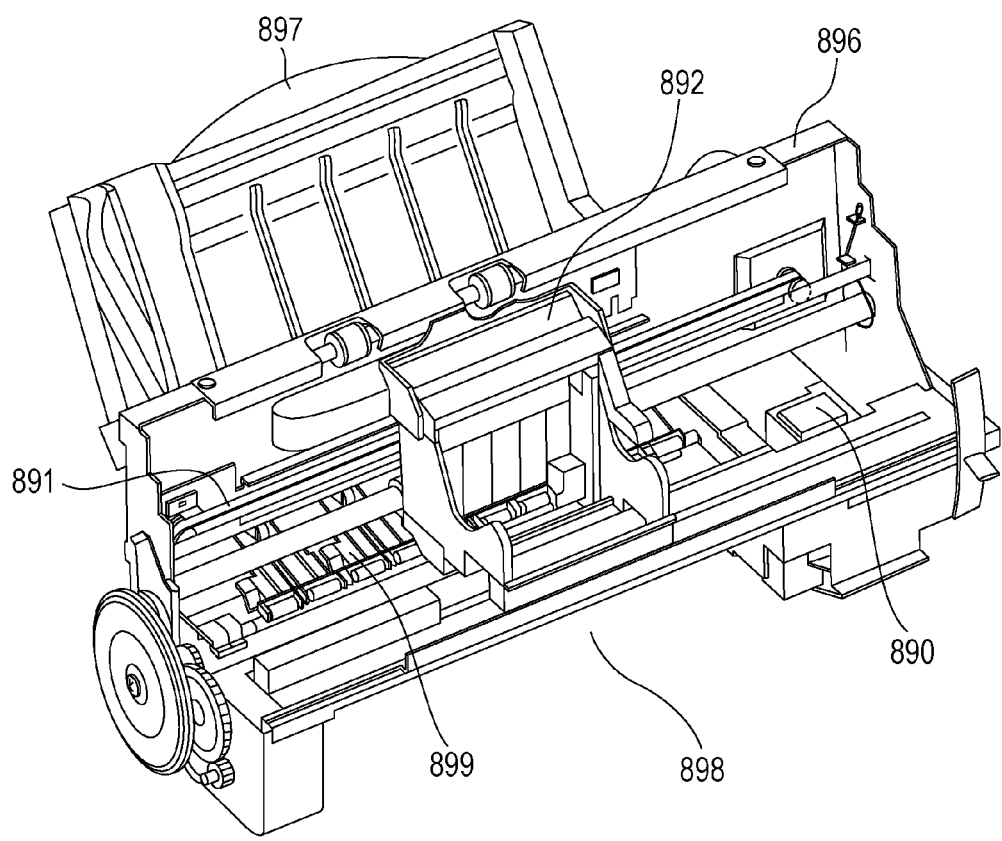
FIG. 5 is a schematic view showing the liquid ejection apparatus according to an embodiment of the present invention.

An example of the liquid ejection apparatus according to an embodiment of the present invention is an ink jet recording apparatus shown in FIGS. 4 and 5. FIG. 5 shows the state in which outer casings 882 to 885 and 887 are detached from a liquid ejection apparatus (ink jet recording apparatus) 881 shown in FIG. 4. The ink jet recording apparatus 881 includes an automatic supply unit 897 that automatically supplies a recording sheet serving as a transfer member into a main body 896 of the apparatus. The ink jet recording apparatus 881 further includes a transport unit 899 that is a placing unit of the transfer member and that guides the recording sheet supplied from the automatic supply unit 897 to a predetermined recording position and from the recording position to an ejection slot 898, a recording unit 891 that conducts recording on the recording sheet transported to the recording position, and a recovery unit 890 that conducts a recovery process on the recording unit 891. The recording unit 891 has a carriage 892 that houses the liquid ejection head according to an embodiment of the present invention and that moves on a rail in a reciprocating manner. In addition, the user can select a desired transfer member in accordance with the use. The ink jet recording apparatus 881 may be configured so that the liquid ejection head is relatively moved with respect to a transfer member placed on a stage serving as the placing unit.

In this ink jet recording apparatus, when the carriage 892 is moved on the rail by electrical signals transmitted from a computer and a driving voltage is applied to the electrodes sandwiching the piezoelectric material, the piezoelectric material is deformed. This deformation of the piezoelectric material pressurizes the individual liquid chamber 102 through the diaphragm 103 shown in FIG. 3B, and causes ink to be ejected from the ejection port 105, thus conducting printing.

The liquid ejection apparatus according to an embodiment of the present invention can eject a liquid uniformly at a high speed. In addition, the size of the liquid ejection apparatus can be reduced.

An example of a printer has been described above. However, the liquid ejection apparatus according to an embodiment of the present invention can be used as industrial liquid ejection apparatuses besides ink jet recording apparatuses such as facsimile machines, multifunction apparatuses, and copy machines.

Ultrasonic Motor

An ultrasonic motor according to an embodiment of the present invention will now be described. An ultrasonic motor according to an embodiment of the present invention includes at least a vibrating member that includes the piezoelectric element or the multilayered piezoelectric element, and a moving member that contacts the vibrating member.

Figure 6A:
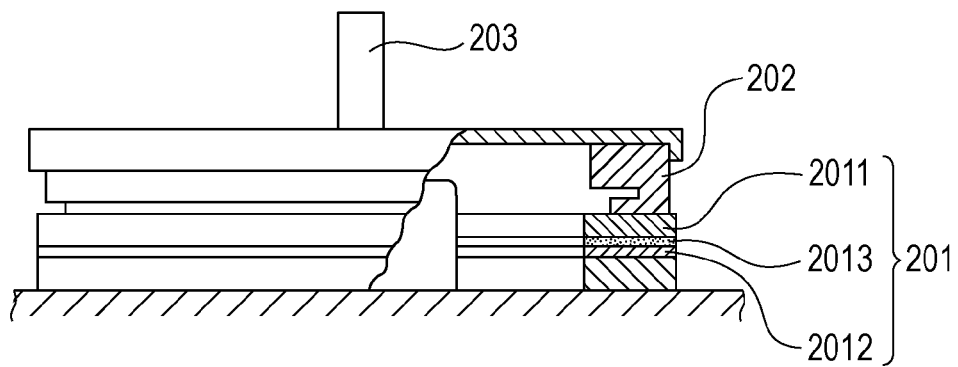
FIGS. 6A and 6B are each a schematic view showing a structure of an ultrasonic motor according to an embodiment of the present invention.
Figure 6B:
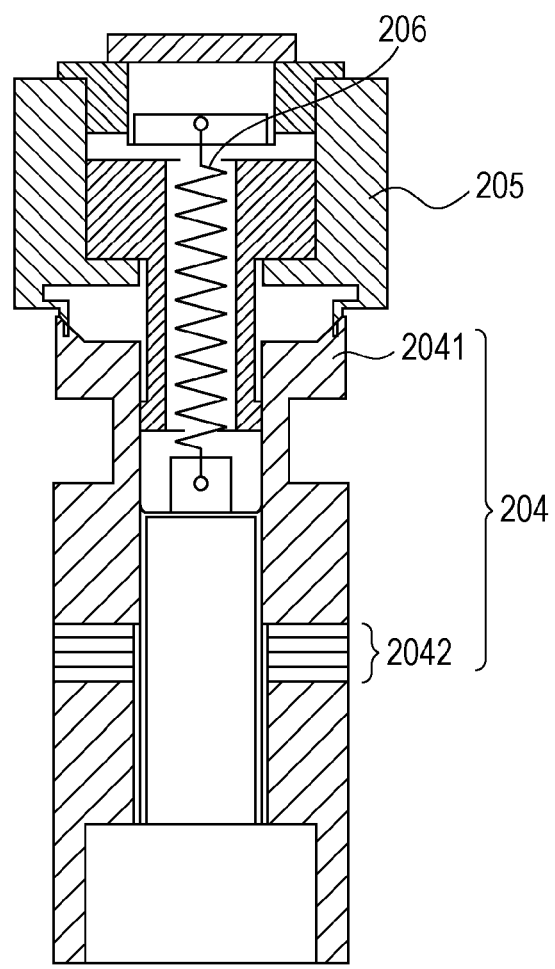

FIGS. 6A and 6B are each a schematic view showing a structure of an ultrasonic motor according to an embodiment of the present invention. FIG. 6A shows an ultrasonic motor that includes a piezoelectric element according to an embodiment of the present invention, the piezoelectric element having a single-layer structure. The ultrasonic motor includes an oscillator 201, a rotor 202 that contacts a sliding surface of the oscillator 201 with a pressing force from a pressing spring (not shown), and an output shaft 203 that is integrally provided with the rotor 202. The oscillator 201 includes a metal elastic ring 2011, a piezoelectric element 2012 according to an embodiment of the present invention, and an organic adhesive 2013 (such as an epoxy-based or cyanoacrylate-based adhesive) that bonds the piezoelectric element 2012 to the elastic ring 2011. The piezoelectric element 2012 is composed of a piezoelectric material sandwiched between a first electrode and a second electrode (not shown).

When two phases of an alternating voltage that are different from each other by an odd number time of $\pi/2$ are applied to the piezoelectric element 2012, a bending traveling wave is generated in the oscillator 201 and each point on the sliding surface of the oscillator 201 moves elliptically. When the rotor 202 is in contact with the sliding surface of the oscillator 201 under pressure, the rotor 202 receives a frictional force from the oscillator 201 and rotates in a direction opposite to that of the bending travelling wave. An object to be driven (not shown) is joined to the output shaft 203 and is driven by the rotation force of the rotor 202.

When a voltage is applied to the piezoelectric material, the piezoelectric material is expanded and contracted by the piezoelectric transversal effect. In the case where an elastic member such as a metal member is joined to the piezoelectric element, the elastic member is bent as a result of expansion and contraction of the piezoelectric material. The ultrasonic motor described here is a type of an ultrasonic motor that utilizes this principle.

FIG. 6B shows an example of an ultrasonic motor including a piezoelectric element having a multilayered structure. An oscillator 204 includes a cylindrical metal elastic member 2041 and a multilayered piezoelectric element 2042 disposed in the metal elastic member 2041. The multilayered piezoelectric element 2042 includes a plurality of stacked layers (not shown) composed of piezoelectric materials. A first electrode and a second electrode are disposed on outer surfaces of the stacked body and internal electrodes are disposed inside the stacked body. The metal elastic member 2041 is fixed with a bolt to sandwich the multilayered piezoelectric element 2042, thus constituting the oscillator 204.

By applying different phases of an alternating voltage to the multilayered piezoelectric element 2042, the oscillator 204 excites two oscillations orthogonal to each other. These two oscillations are combined to form a circular oscillation that drives a tip of the oscillator 204. An annular recessed groove is formed in the upper portion of the oscillator 204 to increase the displacement of the oscillation for driving.

A rotor 205 is in contact with the oscillator 204 under pressure with a pressing spring 206 and receives a frictional force for driving. The rotor 205 is rotatably supported by a bearing.

Optical Apparatus

An optical apparatus according to an embodiment of the present invention will now be described. An optical apparatus according to an embodiment of the present invention includes a driving unit including the ultrasonic motor described above.

Figure 7A:
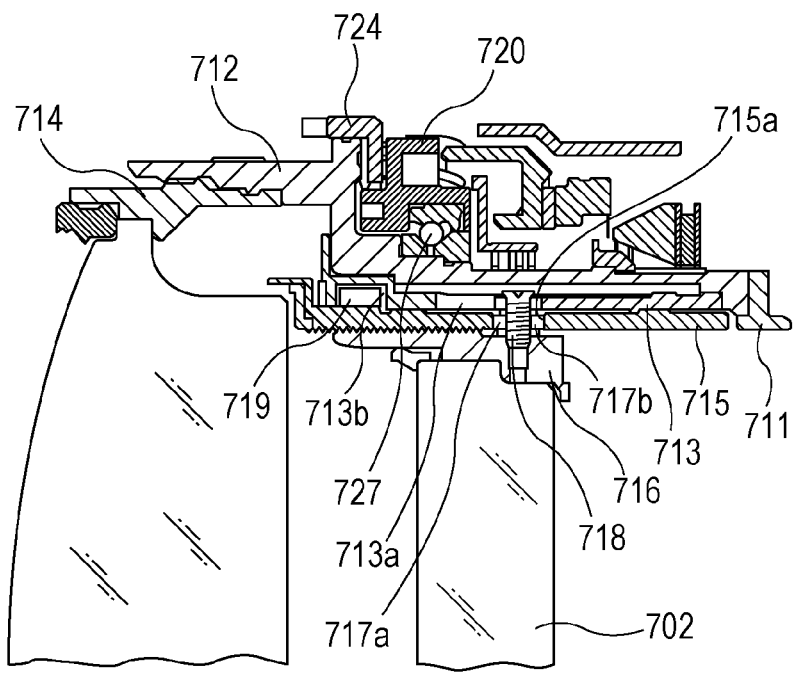
FIGS. 7A and 7B are each a schematic view showing an optical apparatus according to an embodiment of the present invention.
Figure 7B:
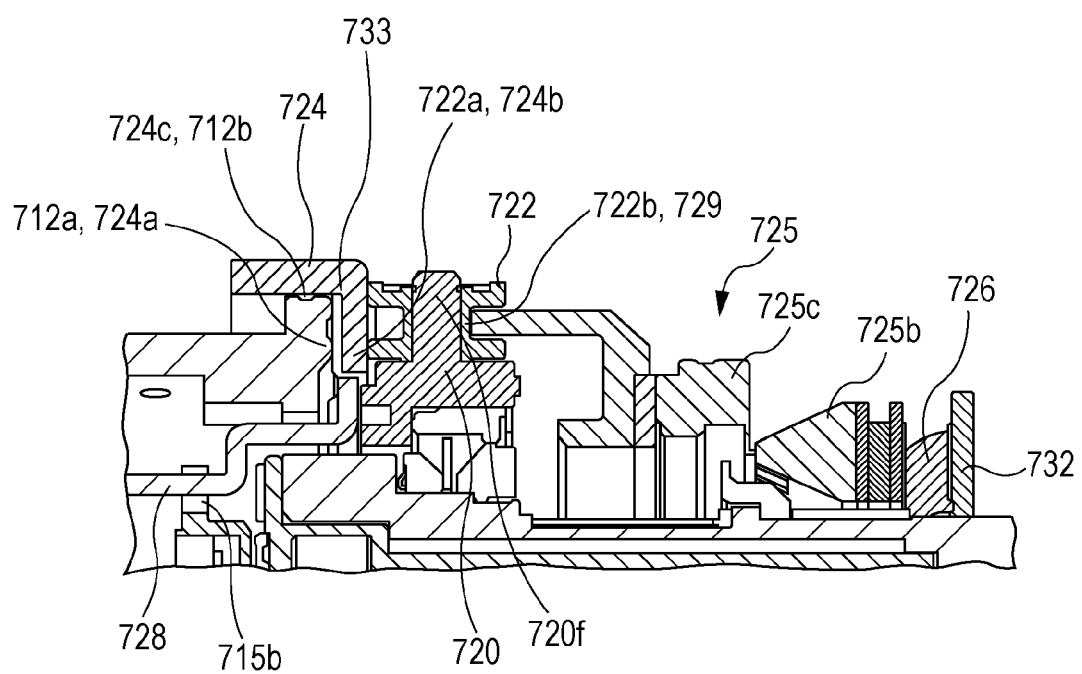
Figure 8:
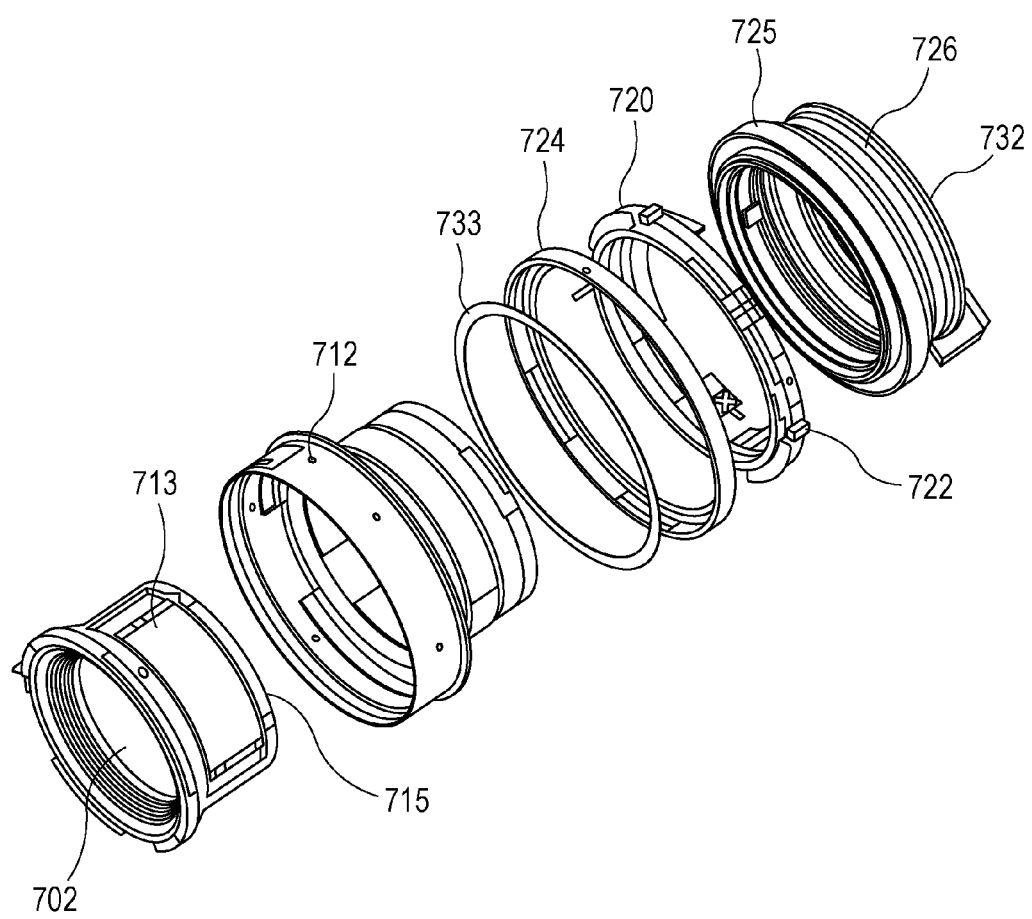
FIG. 8 is a schematic view showing the optical apparatus according to an embodiment of the present invention.

FIGS. 7A and 7B are each a cross-sectional view of a relevant part of a replaceable lens barrel of a single-lens reflex camera, which is an example of an optical apparatus according to an embodiment of the present invention. FIG. 8 is an exploded perspective view of the replaceable lens barrel of a single-lens reflex camera, which is an example of an optical apparatus according to an embodiment of the present invention. A fixed barrel 712, a linear guide barrel 713, and a front group lens barrel 714 are fixed to a mount 711 that is attachable to and detachable from a camera. These are fixed members of the replaceable lens barrel.

A linear guide groove 713*a* for a focus lens 702, the linear guide groove 713*a* extending in an optical axis direction, is formed in the linear guide barrel 713. Cam rollers 717*a* and 717*b* that protrude in an outer radial direction are fixed, with a shaft screw 718, to a rear group lens barrel 716 holding the focus lens 702. The cam roller 717*a* is fitted in the linear guide groove 713*a*.

A cam ring 715 is rotatably fitted to the inner periphery of the linear guide barrel 713. A roller 719 fixed to the cam ring 715 is fitted in an annular groove 713b of the linear guide barrel 713. This structure regulates relative movements between the linear guide barrel 713 and the cam ring 715 in the optical axis direction. A cam groove 715a for the focus lens 702 is formed in the cam ring 715. The cam roller 717b is fitted in the cam groove 715a.

A rotation transmission ring 720 is disposed on the outer peripheral side of the fixed barrel 712. The rotation transmission ring 720 is held by a ball race 727 so as to rotate at a particular position with respect to the fixed barrel 712. A roller 722 is rotatably held by a shaft 720f extending in a radial manner from the rotation transmission ring 720. A large-diameter portion 722a of the roller 722 is in contact with a mount-side end surface 724b of a manual focus ring 724. A small-diameter portion 722b of the roller 722 is in contact with a joint member 729. Six rollers 722 are arranged on the outer periphery of the rotation transmission ring 720 at regular intervals, and each of the rollers 722 is configured to have the relationship described above.

A low-friction sheet (washer member) 733 is arranged on the inner circumferential portion of the manual focus ring 724. The low-friction sheet 733 is interposed between a mount-side end surface 712a of the fixed barrel 712 and a front-side end surface 724a of the manual focus ring 724. The outer circumferential surface of the low-friction sheet 733 has a ring shape and is fitted in an inner circumferential portion 724c of the manual focus ring 724. The inner circumferential portion 724c of the manual focus ring 724 is fitted in an outer circumferential portion 712b of the fixed barrel 712. The low-friction sheet 733 has a function of reducing the friction in a rotary ring mechanism in which the manual focus ring 724 rotates about the optical axis relative to the fixed barrel 712.

The large-diameter portion 722a of the roller 722 is brought into contact with the mount-side end surface 724b of the manual focus ring 724 under pressure by a force generated by a wave washer 726 that presses an ultrasonic motor 725 toward the front side of the lens. Similarly, the small-diameter portion 722b of the roller 722 is brought into contact with the joint member 729 under an appropriate degree of pressure by a force generated by the wave washer 726 that presses the ultrasonic motor 725 toward the front side of the lens. The movement of the wave washer 726 in the mount direction is regulated by a washer 732 that is bayonet-mounted on the fixed barrel 712. A spring force (urging force) generated by the wave washer 726 is transmitted to the ultrasonic motor 725 and the roller 722 and also serves as a pressing force of the manual focus ring 724 against the mount-side end surface 712a of the fixed barrel 712. That is, the manual focus ring 724 is fitted while being pressed on the mount-side end surface 712a of the fixed barrel 712 with the low-friction sheet 733 therebetween.

Accordingly, when the ultrasonic motor 725 is rotated with respect to the fixed barrel 712 by a controlling unit (not shown), the roller 722 rotates about the center of the shaft 720f because the joint member 729 is in frictional contact with the small-diameter portion 722b of the roller 722. When the roller 722 rotates about the shaft 720f, the rotation transmission ring 720 consequently rotates about the optical axis (automatic focusing operation).

When a rotation force about the optical axis is applied from a manual operation input unit (not shown) to the manual focus ring 724, the roller 722 rotates about the shaft 720f by a frictional force because the mount-side end surface 724b of the manual focus ring 724 is in contact with the large-diameter portion 722a of the roller 722 under pressure.

When the large-diameter portion 722a of the roller 722 rotates about the shaft 720f, the rotation transmission ring 720 rotates about the optical axis. The ultrasonic motor 725 is configured so that the ultrasonic motor 725 does not rotate at this time due to a frictional retention force of a rotor 725c and a stator 725b (manual focusing operation).

Two focus keys 728 are attached to the rotation transmission ring 720 at positions facing each other. The focus keys 728 are fitted in notches 715b provided at an end of the cam ring 715. Accordingly, when the automatic focusing operation or the manual focusing operation is performed and the rotation transmission ring 720 is rotated about the optical axis, the rotation force is transmitted to the cam ring 715 through the focus keys 728. When the cam ring 715 is rotated about the optical axis, the rear group lens barrel 716, whose rotation is regulated by the cam roller 717a and the linear guide groove 713a, is moved back and forth along the cam groove 715a in the cam ring 715 by the cam roller 717b. Thus, the focus lens 702 is driven and a focusing operation is conducted.

A replaceable lens barrel of a single-lens reflex camera has been described as an example of the optical apparatus according to an embodiment of the present invention. However, the optical apparatus may be any type of camera such as a compact camera or an electronic still camera. The present invention is applicable to any optical apparatus that includes a driving unit including an ultrasonic motor.

Vibration Apparatus and Dust Removing Device

Vibration apparatuses used in the transportation, removal, etc. of particles, powders, and liquid droplets are widely used in electronic apparatuses etc. A dust removing device including a piezoelectric element according to an embodiment of the present invention will now be described as an example of a vibration apparatus according to an embodiment of the present invention.

A dust removing device according to an embodiment of the present invention includes at least a vibrating member that includes a diaphragm and the piezoelectric element or multilayered piezoelectric element described above disposed on the diaphragm.

Figure 9A:
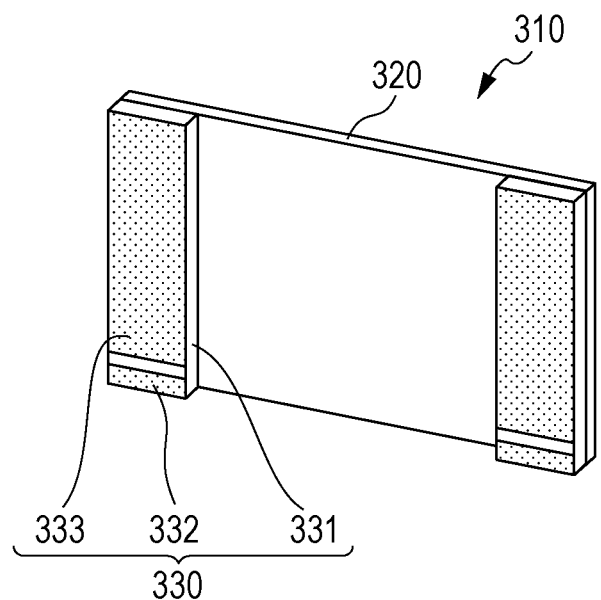
FIGS. 9A and 9B are each a schematic view showing a dust removing device which includes a vibration apparatus according to an embodiment of the present invention.
Figure 9B:
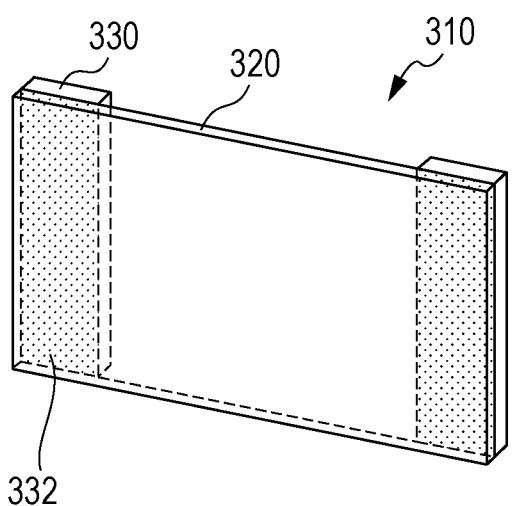

FIGS. 9A and 9B are each a schematic view showing a dust removing device according to an embodiment of the present invention. A dust removing device 310 includes plate-shaped piezoelectric elements 330 and a diaphragm 320. The piezoelectric elements 330 may each be a multilayered piezoelectric element according to an embodiment of the present invention. The material of the diaphragm 320 is not particularly limited. However, in the case where the dust removing device 310 is used in an optical device, a light-transmissive material or a light-reflecting material can be used as the diaphragm 320.

Figure 10A:
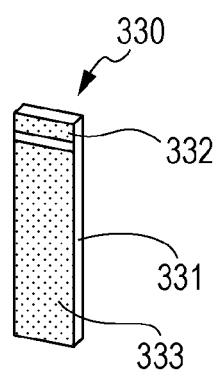
FIGS. 10A to 10C are each a schematic view showing a structure of a piezoelectric element in the dust removing device according to an embodiment of the present invention.
Figure 10B:
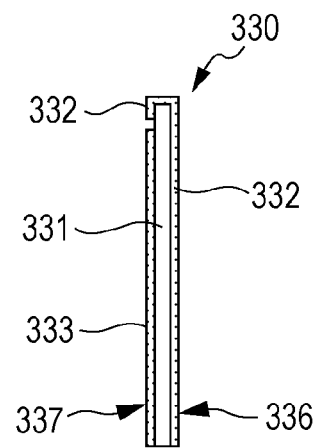
Figure 10C:
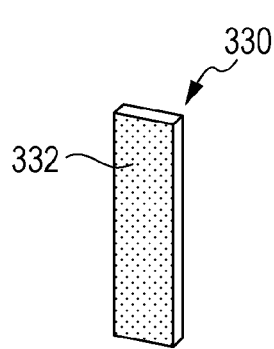

FIGS. 10A to 10C are each a schematic view showing a structure of the piezoelectric element 330 in FIGS. 9A and 9B. FIGS. 10A and 10C show the structures of a front surface and a back surface of the piezoelectric element 330. FIG. 10B shows the structure of a side surface of the piezoelectric element 330. As shown in FIGS. 9A and 9B, the piezoelectric element 330 includes a piezoelectric material 331, a first electrode 332, and a second electrode 333. The first electrode 332 and the second electrode 333 are arranged on surfaces of the piezoelectric material 331 so as to face each other. Similarly to the case shown in FIGS. 9A and 9B, the piezoelectric element 330 may each be a multilayered piezoelectric element according to an embodiment of the present invention. In such a case, the piezoelectric material 331 may have a structure in which piezoelectric material layers and internal electrodes are alternately stacked, and the internal electrodes may be alternately short-circuited through the first electrode 332 or the second electrode 333, whereby a drive waveform having different phases in each of the piezoelectric material layers can be provided. In FIG. 10C, a surface which is disposed as a front surface of the piezoelectric element 330 and on which the first electrode 332 is provided is defined as a first electrode surface 336. In FIG. 10A, a surface which is disposed as a front surface of the piezoelectric element 330 and on which the second electrode 333 is provided is defined as a second electrode surface 337.

Herein, the term "electrode surface" refers to a surface of a piezoelectric element, the surface having an electrode thereon. For example, as shown in FIG. 10B, the first electrode 332 may extend to the second electrode surface 337.

As shown in FIGS. 9A and 9B, the first electrode surface 336 of the piezoelectric element 330 is bonded to a surface of the diaphragm 320. When the piezoelectric element 330 is driven and a stress is generated between the piezoelectric element 330 and the diaphragm 320, an out-of-plane vibration is generated in the diaphragm. The dust removing device 310 according to an embodiment of the present invention removes foreign matter such as dust adhering to a surface of the diaphragm 320 by using the out-of-plane vibration of the diaphragm 320. The term "out-of-plane vibration" refers to elastic vibration that displaces a diaphragm in an optical axis direction, that is, in a direction of the thickness of the diaphragm.

Figure 11A:
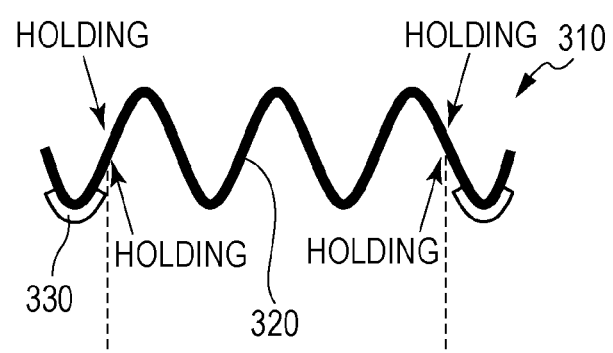
FIGS. 11A and 11B are each a schematic view showing a vibration principle of a dust removing device according to an embodiment of the present invention.
Figure 11B:
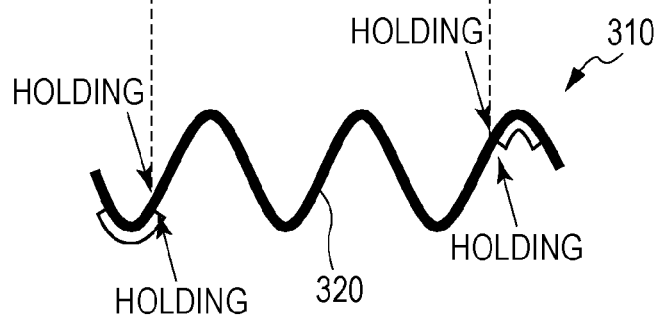

FIGS. 11A and 11B are each a schematic view showing a vibration principle of the dust removing device 310 according to an embodiment of the present invention. FIG. 11A shows a state in which out-of-plane vibration is generated in the diaphragm 320 by applying an in-phase alternating voltage to a left-and-right pair of piezoelectric elements 330. The polarization direction of the piezoelectric material constituting the left-and-right pair of piezoelectric elements 330 is the same as the direction of the thicknesses of the piezoelectric elements 330. The dust removing device 310 is driven in the seventh-order vibration mode. FIG. 11B shows a state in which out-of-plane vibration is generated in the diaphragm 320 by applying an anti-phase alternating voltage to the left-and-right pair of piezoelectric elements 330 in which the phases are opposite to each other by 180°. The dust removing device 310 is driven in the sixth-order vibration mode. The dust removing device 310 according to an embodiment of the present invention can effectively remove dust adhering to a surface of the diaphragm by properly using at least two vibration modes.

Image Pickup Device

Figure 12:
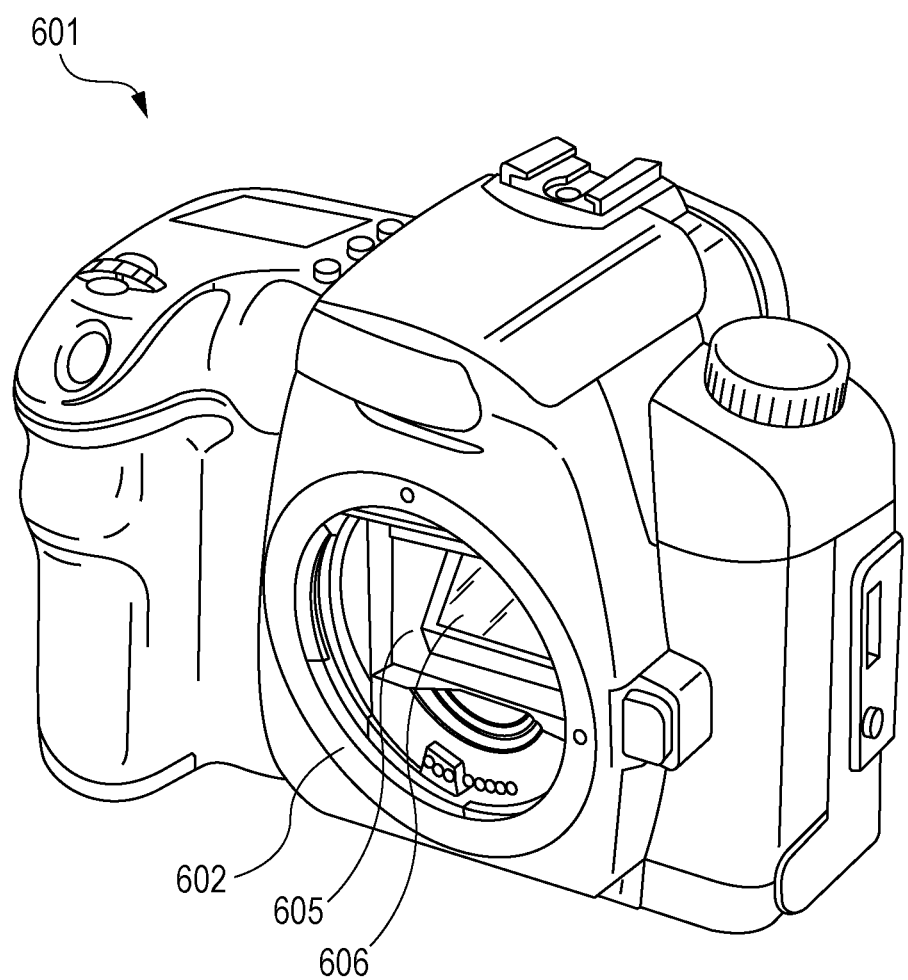
FIG. 12 is a schematic view showing an image pickup device according to an embodiment of the present invention.
Figure 13:
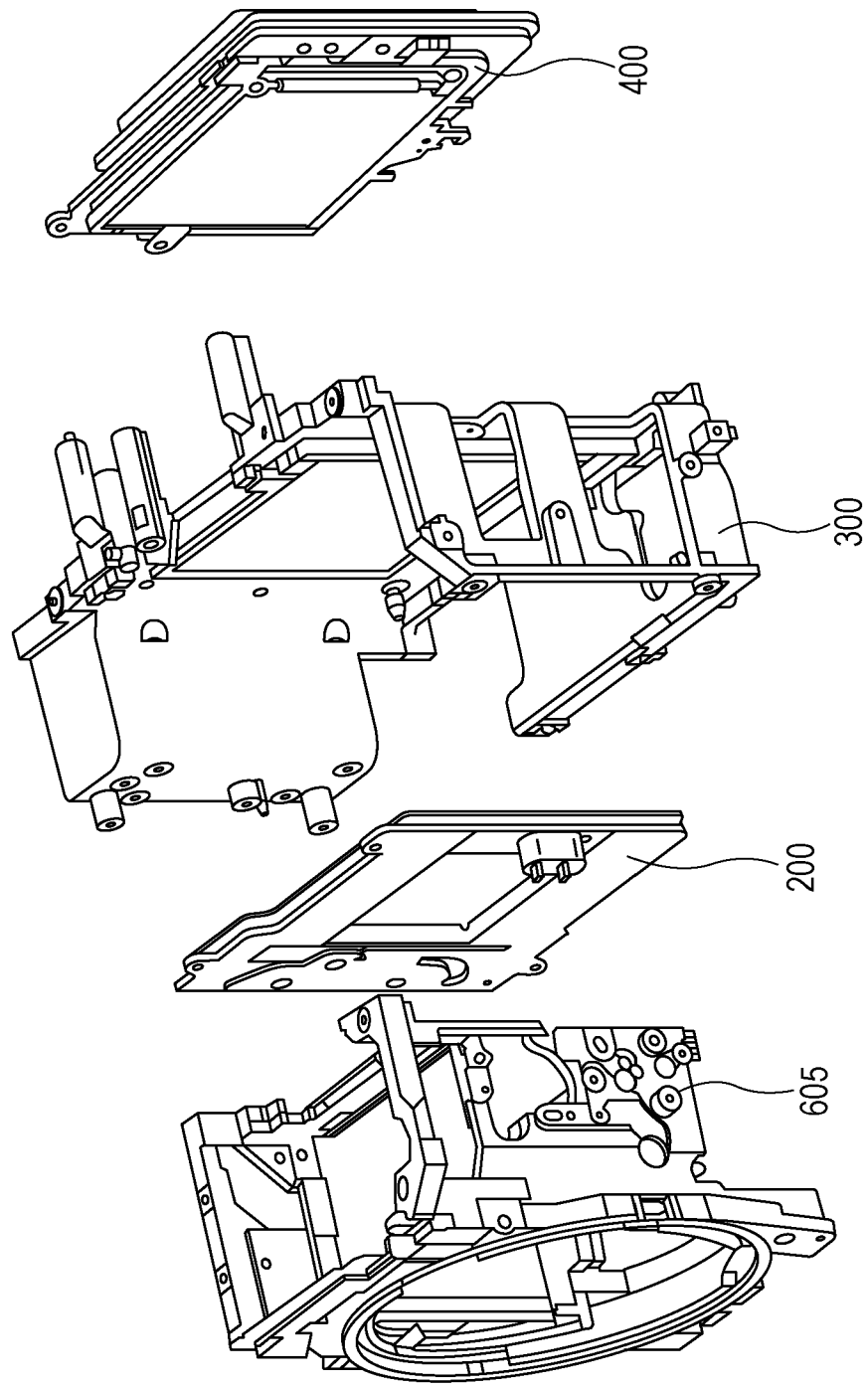
FIG. 13 is a schematic view showing an image pickup device according to an embodiment of the present invention.

An image pickup device according to an embodiment of the present invention will now be described. An image pickup device according to an embodiment of the present invention includes at least the dust removing device according to an embodiment of the present invention and an image pickup element unit, in which a diaphragm of the dust removing device is disposed on a light-receiving surface side of the image pickup element unit. FIGS. 12 and 13 are each a view showing a digital single-lens reflex camera, which is an example of an image pickup device according to an embodiment of the present invention.

FIG. 12 is a front-side perspective view of a camera main body 601 viewed from the object side and shows a state in which an imaging lens unit is detached. FIG. 13 is an exploded perspective view showing a schematic structure of the inside of the camera for illustrating the dust removing device according to an embodiment of the present invention and a peripheral structure of an image pickup element unit 400.

In the camera main body 601, a mirror box 605 into which an image-taking light beam passing through an imaging lens is guided is provided, and a main mirror (quick return mirror) 606 is provided in the mirror box 605. The main mirror 606 can be maintained at an angle of 45° with respect to an imaging optical axis to guide the image-taking light beam in a direction of a penta-dach mirror (not shown) or can be maintained at a position retracted from the image-taking light beam to guide the image-taking light beam in a direction of an image pickup element (not shown).

On the object side of a body chassis 300, which functions as a skeleton of the camera main body, the mirror box 605 and a shutter unit 200 are arranged in that order from the object side. An image pickup element unit 400 is disposed on the photographer side of the body chassis 300. The image pickup element unit 400 is arranged by being adjusted so that an image pickup area of the image pickup element is arranged parallel to a fitting surface of a mount portion 602, which functions as a reference for attaching the imaging lens unit, with a predetermined space therebetween.

A digital single-lens reflex camera has been described as an image pickup device according to an embodiment of the present invention. However, the image pickup device may be an imaging lens unit replaceable camera such as a mirrorless digital single-lens reflex camera that does not include the mirror box 605. Furthermore, among various image pickup devices, such as an imaging lens unit replaceable video camera, a copy machine, a facsimile, and a scanner, or electronic and electrical apparatuses having image pickup devices, in particular, the present invention can also be applied to apparatuses which are required to remove dust adhering to surfaces of optical components thereof.

Electronic Apparatus

An electronic apparatus according to an embodiment of the present invention will now be described. An electronic apparatus according to an embodiment of the present invention includes a piezoelectric acoustic component including the piezoelectric element or the multilayered piezoelectric element described above.

Figure 14:
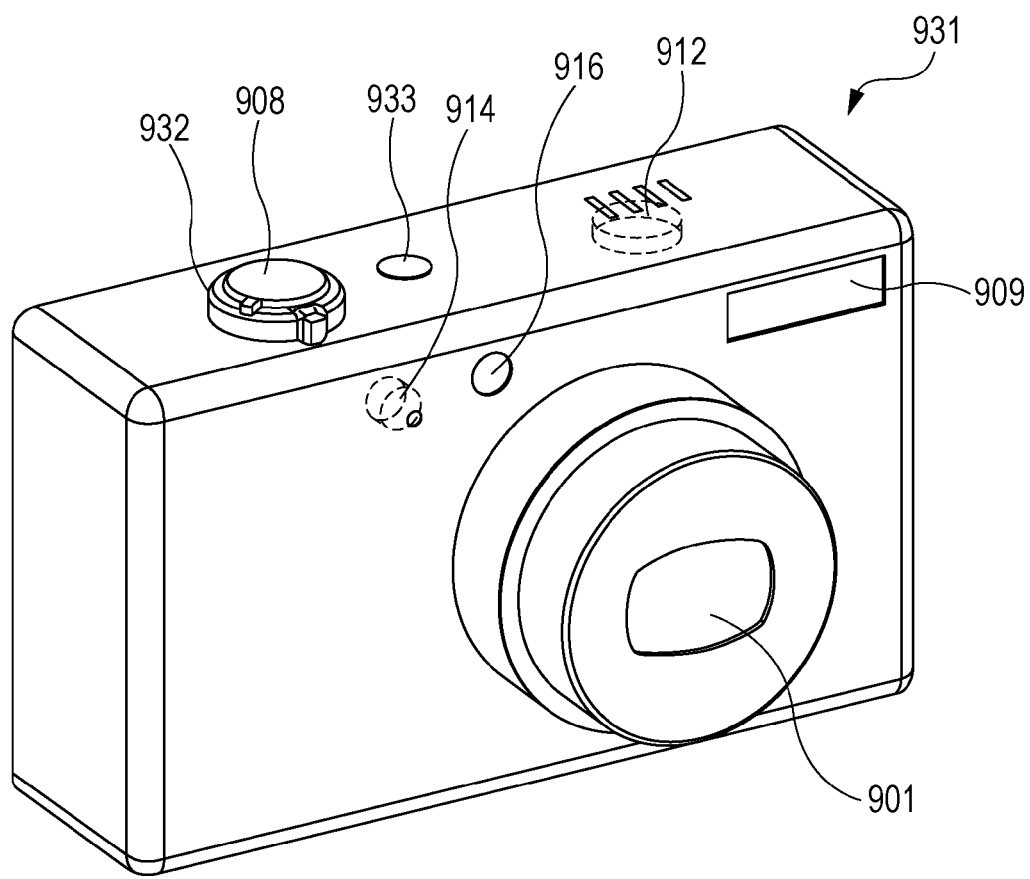
FIG. 14 is a schematic view showing an electronic apparatus according to an embodiment of the present invention.
Figure 15A:
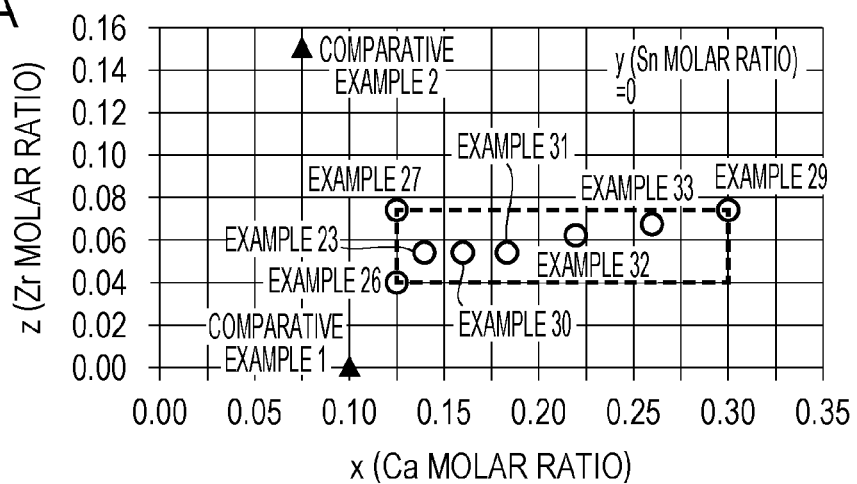
FIGS. 15A to 15C are phase diagrams showing the relationship between the value of x and the value of z when the value of y of piezoelectric materials of Examples 1 to 34 of the present invention and Comparative Examples 1 to 10 is 0, 0.01, and 0.02, respectively. The inside of the dotted-line box shows the range of the value of x and the value of z in the first aspect of the present invention.
Figure 15B:
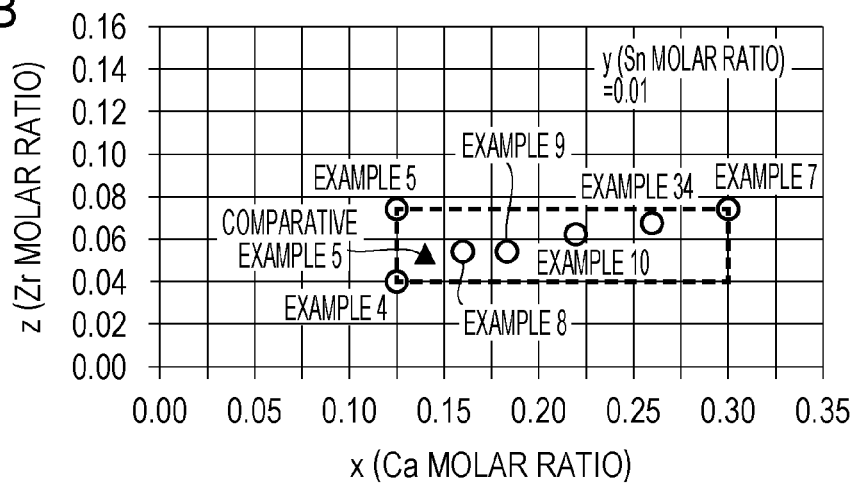
Figure 15C:
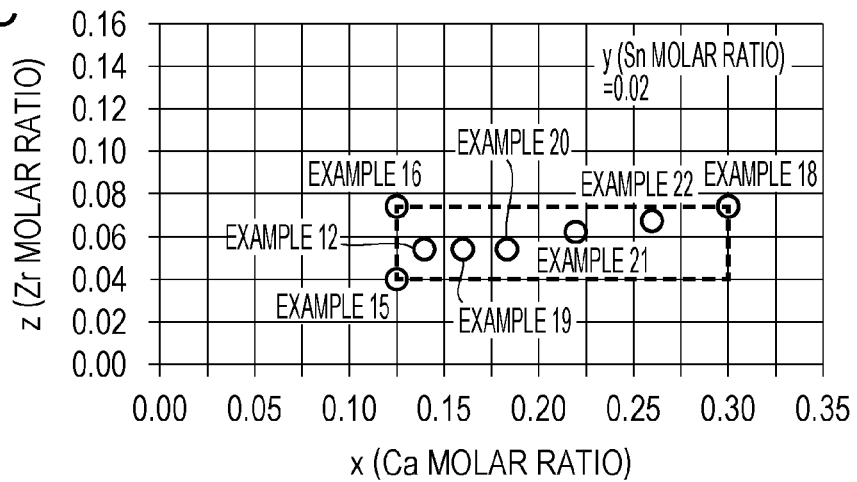

FIG. 14 is an entire perspective view of a digital camera, which is an example of the electronic apparatus according to an embodiment of the present invention, as viewed from the front of a main body 931. An optical device 901, a microphone 914, a strobe light-emitting unit 909, and an auxiliary light unit 916 are installed in the front surface of the main body 931. Since the microphone 914 is provided inside the main body 931, the microphone 914 is shown by a broken line. A hole for collecting sound from the outside is provided at the front of the microphone 914.

A power button 933, a speaker 912, a zoom lever 932, and a release button 908 for performing a focusing operation are installed in the upper surface of the main body 931. Since the speaker 912 is provided inside the main body 931, the speaker 912 is shown by a broken line. Holes for outputting sound to the outside are provided at the front of the speaker 912.

The piezoelectric acoustic component according to an embodiment of the present invention can be used in at least one of the microphone 914 and the speaker 912. The piezoelectric acoustic component according to an embodiment of the present invention also includes a surface acoustic wave filter (SAW filter).

A digital camera has been described as an example of the electronic apparatus according to an embodiment of the present invention. However, the electronic apparatus according to an embodiment of the present invention may be applied to any electronic apparatus including a piezoelectric acoustic component, such as a sound-reproducing apparatus, a sound-recording apparatus, a mobile phone, or an information terminal.

The piezoelectric material according to an embodiment of the present invention has a good, stable piezoelectric constant and a good, stable mechanical quality factor in a wide operating temperature range. Furthermore, since the piezoelectric material does not contain lead, the piezoelectric material has a low environmental load. Accordingly, the piezoelectric material according to an embodiment of the present invention can be used without problems even in apparatuses in which a large amount of piezoelectric material is used, such as a liquid ejection head, a liquid ejection apparatus, an ultrasonic motor, an optical apparatus, a vibration apparatus, a dust removing device, an image pickup device, and an electronic apparatus.

EXAMPLES

The present invention will now be described more specifically by using Examples. However, the present invention is not limited to the Examples described below. Piezoelectric materials according to embodiments of the present invention were prepared.

Piezoelectric Material

Piezoelectric Material of Example 1

Raw materials corresponding to a composition $((Ba_{0.860}Ca_{0.140})_{1.006}(Ti_{0.936}Sn_{0.010}Zr_{0.054})O_3)$ that is obtained by substituting $x=0.140$, $y=0.010$, $z=0.054$, and $a=1.006$ into a general formula represented by $(Ba_{1-x}Ca_x)_a(Ti_{1-y-z}Sn_yZr_z)O_3$ were mixed in a manner described below.

Barium titanate ($BaTiO_3$) having an average grain diameter of 100 nm, calcium titanate ($CaTiO_3$), calcium zirconate ($CaZrO_3$), and calcium stannate ($CaSnO_3$) were weighed so that the ratio was 86.0:7.6:5.4:1.0 on a molar basis. In order to adjust the ratio $\alpha$ of the total molar amount of Ba and Ca in A sites to the total molar amount of Ti, Sn, and Zr in B sites to 1.006, barium oxalate was weighed and mixed. Copper oxide (CuO) was weighed so that the weight of Cu was 0.10 parts by weight on a metal basis, and trimanganese tetraoxide ($Mn_3O_4$) was weighed so that the weight of Mn was 0.24 parts by weight on a metal basis relative to the mixed powder. The copper oxide and trimanganese tetraoxide were mixed with the powder prepared above. The resulting mixture was dry-mixed in a ball mill for 24 hours.

Subsequently, 3 parts by weight of a PVA binder relative to the mixed powder was caused to adhere to surfaces of the mixed powder by using a spray dryer in order to granulate the mixed powder.

Next, the granulated powder was charged in a mold and pressed under a molding pressure of 200 MPa by using a press-molding machine to prepare a disk-shaped compact. The compact may be further pressed by using a cold isostatic press-molding machine. Also in such a case, the same results were obtained.

The compact was placed in an electric furnace and sintered in an air atmosphere over a period of 24 hours during which a maximum temperature of 1,380° C. was maintained for five hours. Thus, a piezoelectric ceramic material according to an embodiment of the present invention was obtained.

The average equivalent circular diameter of crystal grains constituting the resulting ceramic and the relative density of the ceramic were evaluated. According to the results, the average equivalent circular diameter was 7.1 µm and the relative density was 95.8%. A polarizing microscope was mainly used to observe crystal grains. When the grain diameters of small crystal grains were determined, a scanning electron microscope (SEM) was used. The average equivalent circular diameter was calculated on the basis of the observation results. The relative density was evaluated by a theoretical density calculated from lattice constants determined by X-ray diffraction and the composition determined by weighing and a density that was actually measured by the Archimedes method.

The prepared piezoelectric material was then polished such that the thickness thereof became 0.5 mm and the crystal structure of the piezoelectric material was analyzed by X-ray diffraction. According to the results, only peaks attributable to a perovskite structure were observed. The composition of the piezoelectric material was evaluated by X-ray fluorescence analysis. The results showed that the piezoelectric material contained, as a main component, a metal oxide represented by a chemical formula $(Ba_{0.860}Ca_{0.140})_{1.006}(Ti_{0.936}Sn_{0.010}Zr_{0.054})O_3$, and 0.10 parts by weight of Cu and 0.24 parts by weight of Mn were contained relative to 100 parts by weight of the main component. Regarding other metal components, the composition determined by weighing was identical to the composition after sintering. The contents of the elements other than Ba, Ca, Ti, Sn, Zr, Cu, and Mn were lower than detection limits.

Piezoelectric Materials of Examples 2 to 34

Barium titanate, calcium titanate, calcium zirconate, and calcium stannate that were the same as those used in Example 1 were weighed so that the molar ratio was as shown in Table 1. In order to adjust the ratio a of the total molar amount of Ba and Ca in A sites to the total molar amount of Ti, Sn, and Zr in B sites, barium oxalate was weighed and mixed. Copper oxide (CuO) and trimanganese tetraoxide ($Mn_3O_4$) were weighed so that the amounts of metal elements were as shown in Table 1 on a metal basis relative to the mixed powder and mixed with the powder prepared above. The resulting mixture was dry-mixed in a ball mill for 24 hours.

Subsequently, 3 parts by weight of a PVA binder relative to the mixed powder was caused to adhere to surfaces of the mixed powder by using a spray dryer in order to granulate the mixed powder.

The granulated powder was charged in a mold and pressed under a molding pressure of 200 MPa by using a press-molding machine to prepare a disk-shaped compact as in Example 1.

The compact was placed in an electric furnace and sintered in an air atmosphere over a period of 24 hours during which a maximum temperature of 1,380° C. was maintained for five hours. Thus, piezoelectric ceramic materials according to embodiments of the present invention were obtained.

The average equivalent circular diameter of crystal grains constituting each of the resulting piezoelectric materials and the relative density of each of the piezoelectric materials were evaluated as in Example 1. The average equivalent circular diameter was in the range of 2.3 to 9.4 µm. The results of the relative density are shown in Table 2.

Next, each of the prepared piezoelectric materials was polished such that the thickness thereof became 0.5 mm and the crystal structure of the piezoelectric material was analyzed by X-ray diffraction as in Example 1. According to the results, only peaks attributable to a perovskite structure were observed in each of the samples.

The composition of the piezoelectric material was evaluated by X-ray fluorescence analysis as in Example 1. The results are shown in Table 3. The contents of auxiliary components, which were elements other than Ba, Ca, Ti, Sn, Zr, Cu, and Mn, were lower than detection limits. In each of the samples, the composition determined by weighing was identical to the composition after sintering.

Piezoelectric Materials of Comparative Examples 1 to 10

Weighing was conducted as in the steps of Examples 1 to 34 so that the composition ratio was as shown in Table 1. The resulting mixture was dry-mixed in a ball mill for 24 hours, and then granulated.

Ceramics were prepared using the granulated powders under the same conditions as those of Examples 1 to 34.

The average equivalent circular diameter of crystal grains constituting each of the resulting ceramics and the relative density of each of the ceramics were evaluated. The average equivalent circular diameter of the samples of Comparative Examples 1 to 3 and Comparative Examples 5 to 10 was in the range of 3.5 to 9.1 μm. The average equivalent circular diameter of the sample of Comparative Example 4 was 50 μm or more. The results of the relative density are shown in Table 2. The relative density was also evaluated as in Examples 1 to 34.

Next, each of the prepared piezoelectric materials was polished such that the thickness thereof became 0.5 mm and the crystal structure of the piezoelectric material was analyzed by X-ray diffraction. According to the results, only peaks attributable to a perovskite structure were observed in each of the samples.

The composition of the piezoelectric material was evaluated by X-ray fluorescence analysis. The results are shown in Table 3. The results showed that, in each of the samples, the composition determined by weighing was identical to the composition after sintering.

TABLE 1

|  | $BaTiO_3$ [mol] | $CaTiO_3$ [mol] | $CaZrO_3$ [mol] | $CaSnO_3$ [mol] | $BaZrO_3$ [mol] | $BaC_2O_4$ [mol] | Amount of Cu added [Parts by weight] | Amount of Mn added [Parts by weight] |
|---|---|---|---|---|---|---|---|---|
| Example 1 | 0.860 | 0.076 | 0.054 | 0.010 | 0.000 | 0.021 | 0.10 | 0.24 |
| Example 2 | 0.860 | 0.076 | 0.054 | 0.010 | 0.000 | 0.021 | 0.05 | 0.26 |
| Example 3 | 0.860 | 0.076 | 0.054 | 0.010 | 0.000 | 0.019 | 0.40 | 0.12 |
| Example 4 | 0.875 | 0.074 | 0.041 | 0.010 | 0.000 | 0.021 | 0.20 | 0.20 |
| Example 5 | 0.875 | 0.041 | 0.074 | 0.010 | 0.000 | 0.016 | 0.20 | 0.15 |
| Example 7 | 0.700 | 0.216 | 0.074 | 0.010 | 0.000 | 0.036 | 0.30 | 0.40 |
| Example 8 | 0.840 | 0.096 | 0.054 | 0.010 | 0.000 | 0.023 | 0.10 | 0.26 |
| Example 9 | 0.817 | 0.119 | 0.054 | 0.010 | 0.000 | 0.019 | 0.10 | 0.22 |
| Example 10 | 0.780 | 0.148 | 0.062 | 0.010 | 0.000 | 0.033 | 0.40 | 0.30 |
| Example 11 | 0.740 | 0.182 | 0.068 | 0.010 | 0.000 | 0.039 | 0.60 | 0.32 |
| Example 12 | 0.860 | 0.066 | 0.054 | 0.020 | 0.000 | 0.021 | 0.10 | 0.24 |
| Example 13 | 0.860 | 0.066 | 0.054 | 0.020 | 0.000 | 0.021 | 0.05 | 0.26 |
| Example 14 | 0.860 | 0.066 | 0.054 | 0.020 | 0.000 | 0.019 | 0.40 | 0.12 |
| Example 15 | 0.875 | 0.064 | 0.041 | 0.020 | 0.000 | 0.021 | 0.20 | 0.20 |
| Example 16 | 0.875 | 0.031 | 0.074 | 0.020 | 0.000 | 0.016 | 0.20 | 0.15 |
| Example 18 | 0.700 | 0.206 | 0.074 | 0.020 | 0.000 | 0.036 | 0.30 | 0.40 |
| Example 19 | 0.840 | 0.086 | 0.054 | 0.020 | 0.000 | 0.023 | 0.10 | 0.26 |
| Example 20 | 0.817 | 0.109 | 0.054 | 0.020 | 0.000 | 0.019 | 0.10 | 0.22 |
| Example 21 | 0.780 | 0.138 | 0.062 | 0.020 | 0.000 | 0.033 | 0.40 | 0.30 |
| Example 22 | 0.740 | 0.172 | 0.068 | 0.020 | 0.000 | 0.039 | 0.60 | 0.32 |
| Example 23 | 0.860 | 0.086 | 0.054 | 0.000 | 0.000 | 0.021 | 0.10 | 0.24 |
| Example 24 | 0.860 | 0.086 | 0.054 | 0.000 | 0.000 | 0.021 | 0.05 | 0.26 |
| Example 25 | 0.860 | 0.086 | 0.054 | 0.000 | 0.000 | 0.019 | 0.40 | 0.12 |
| Example 26 | 0.875 | 0.084 | 0.041 | 0.000 | 0.000 | 0.021 | 0.20 | 0.20 |
| Example 27 | 0.875 | 0.051 | 0.074 | 0.000 | 0.000 | 0.016 | 0.20 | 0.15 |
| Example 29 | 0.700 | 0.226 | 0.074 | 0.000 | 0.000 | 0.036 | 0.30 | 0.40 |
| Example 30 | 0.840 | 0.106 | 0.054 | 0.000 | 0.000 | 0.023 | 0.10 | 0.26 |
| Example 31 | 0.817 | 0.129 | 0.054 | 0.000 | 0.000 | 0.019 | 0.10 | 0.22 |
| Example 32 | 0.780 | 0.158 | 0.062 | 0.000 | 0.000 | 0.033 | 0.40 | 0.30 |
| Example 33 | 0.740 | 0.192 | 0.068 | 0.000 | 0.000 | 0.039 | 0.60 | 0.32 |
| Example 34 | 0.740 | 0.182 | 0.068 | 0.010 | 0.000 | 0.039 | 0.02 | 0.32 |
| Comparative Example 1 | 0.900 | 0.100 | 0.000 | 0.000 | 0.000 | 0.009 | 0.24 | 0.00 |
| Comparative Example 2 | 0.925 | 0.075 | 0.000 | 0.000 | 0.150 | 0.002 | 0.00 | 0.00 |
| Comparative Example 3 | 0.860 | 0.049 | 0.041 | 0.050 | 0.000 | 0.011 | 0.15 | 0.00 |
| Comparative Example 4 | 0.850 | 0.105 | 0.045 | 0.000 | 0.000 | 0.008 | 0.20 | 0.12 |
| Comparative Example 5 | 0.860 | 0.076 | 0.054 | 0.010 | 0.000 | 0.071 | 2.00 | 0.22 |
| Comparative Example 6 | 0.860 | 0.076 | 0.054 | 0.010 | 0.000 | 0.061 | 0.00 | 1.20 |
| Comparative Example 7 | 0.860 | 0.076 | 0.054 | 0.010 | 0.000 | 0.072 | 0.50 | 0.40 |
| Comparative Example 8 | 0.700 | 0.249 | 0.041 | 0.010 | 0.000 | 0.017 | 0.50 | 0.00 |
| Comparative Example 9 | 0.700 | 0.239 | 0.041 | 0.020 | 0.000 | 0.017 | 0.50 | 0.00 |
| Comparative Example 10 | 0.700 | 0.259 | 0.041 | 0.000 | 0.000 | 0.017 | 0.50 | 0.00 |

TABLE 2

| | Relative density [%] |
|---|---|
| Example 1 | 95.8 |
| Example 2 | 94.5 |
| Example 3 | 97.1 |
| Example 4 | 96.2 |
| Example 5 | 97.0 |
| Example 7 | 90.1 |
| Example 8 | 94.6 |
| Example 9 | 94.2 |
| Example 10 | 93.2 |
| Example 11 | 92.5 |
| Example 12 | 95.6 |
| Example 13 | 94.3 |
| Example 14 | 96.9 |
| Example 15 | 95.8 |
| Example 16 | 96.6 |
| Example 18 | 90.2 |
| Example 19 | 94.3 |
| Example 20 | 94.4 |
| Example 21 | 93.1 |
| Example 22 | 92.4 |
| Example 23 | 96.2 |
| Example 24 | 95.1 |
| Example 25 | 94.6 |
| Example 26 | 96.3 |
| Example 27 | 97.0 |
| Example 29 | 90.4 |
| Example 30 | 93.9 |
| Example 31 | 93.5 |
| Example 32 | 93.1 |
| Example 33 | 92.2 |
| Example 34 | 91.5 |
| Comparative Example 1 | 96.1 |
| Comparative Example 2 | 96.2 |
| Comparative Example 3 | 95.4 |
| Comparative Example 4 | 97.4 |
| Comparative Example 5 | 96.5 |
| Comparative Example 6 | 90.3 |
| Comparative Example 7 | 86.1 |
| Comparative Example 8 | 92.1 |
| Comparative Example 9 | 92.2 |
| Comparative Example 10 | 92.8 |

TABLE 3

| | Main component | | | | | | Cu content [Parts by weight] | Mn content [Parts by weight] |
|---|---|---|---|---|---|---|---|---|
| | Ba 1−x | Ca x | Ti 1−y−z | Sn y | Zr z | A/B a | | |
| Example 1 | 0.860 | 0.140 | 0.936 | 0.010 | 0.054 | 1.006 | 0.10 | 0.24 |
| Example 2 | 0.860 | 0.140 | 0.936 | 0.010 | 0.054 | 1.007 | 0.05 | 0.26 |
| Example 3 | 0.860 | 0.140 | 0.936 | 0.010 | 0.054 | 1.001 | 0.40 | 0.12 |
| Example 4 | 0.875 | 0.125 | 0.949 | 0.010 | 0.041 | 1.005 | 0.20 | 0.20 |
| Example 5 | 0.875 | 0.125 | 0.916 | 0.010 | 0.074 | 1.002 | 0.20 | 0.15 |
| Example 7 | 0.700 | 0.300 | 0.916 | 0.010 | 0.074 | 1.010 | 0.30 | 0.40 |
| Example 8 | 0.840 | 0.160 | 0.936 | 0.010 | 0.054 | 1.007 | 0.10 | 0.26 |
| Example 9 | 0.817 | 0.183 | 0.936 | 0.010 | 0.054 | 1.005 | 0.10 | 0.22 |
| Example 10 | 0.780 | 0.220 | 0.928 | 0.010 | 0.062 | 1.008 | 0.40 | 0.30 |
| Example 11 | 0.740 | 0.260 | 0.922 | 0.010 | 0.068 | 1.008 | 0.60 | 0.32 |
| Example 12 | 0.860 | 0.140 | 0.926 | 0.020 | 0.054 | 1.006 | 0.10 | 0.24 |
| Example 13 | 0.860 | 0.140 | 0.926 | 0.020 | 0.054 | 1.007 | 0.05 | 0.26 |
| Example 14 | 0.860 | 0.140 | 0.926 | 0.020 | 0.054 | 1.001 | 0.40 | 0.12 |
| Example 15 | 0.875 | 0.125 | 0.939 | 0.020 | 0.041 | 1.005 | 0.20 | 0.20 |
| Example 16 | 0.875 | 0.125 | 0.906 | 0.020 | 0.074 | 1.002 | 0.20 | 0.15 |
| Example 18 | 0.700 | 0.300 | 0.906 | 0.020 | 0.074 | 1.010 | 0.30 | 0.40 |
| Example 19 | 0.840 | 0.160 | 0.926 | 0.020 | 0.054 | 1.007 | 0.10 | 0.26 |
| Example 20 | 0.817 | 0.183 | 0.926 | 0.020 | 0.054 | 1.005 | 0.10 | 0.22 |
| Example 21 | 0.780 | 0.220 | 0.918 | 0.020 | 0.062 | 1.008 | 0.40 | 0.30 |
| Example 22 | 0.740 | 0.260 | 0.912 | 0.020 | 0.068 | 1.008 | 0.60 | 0.32 |
| Example 23 | 0.860 | 0.140 | 0.946 | 0.000 | 0.054 | 1.006 | 0.10 | 0.24 |
| Example 24 | 0.860 | 0.140 | 0.946 | 0.000 | 0.054 | 1.007 | 0.05 | 0.26 |
| Example 25 | 0.860 | 0.140 | 0.946 | 0.000 | 0.054 | 1.001 | 0.40 | 0.12 |
| Example 26 | 0.875 | 0.125 | 0.959 | 0.000 | 0.041 | 1.005 | 0.20 | 0.20 |
| Example 27 | 0.875 | 0.125 | 0.926 | 0.000 | 0.074 | 1.002 | 0.20 | 0.15 |
| Example 29 | 0.700 | 0.300 | 0.926 | 0.000 | 0.074 | 1.010 | 0.30 | 0.40 |
| Example 30 | 0.840 | 0.160 | 0.946 | 0.000 | 0.054 | 1.007 | 0.10 | 0.26 |
| Example 31 | 0.817 | 0.183 | 0.946 | 0.000 | 0.054 | 1.005 | 0.10 | 0.22 |
| Example 32 | 0.780 | 0.220 | 0.938 | 0.000 | 0.062 | 1.008 | 0.40 | 0.30 |
| Example 33 | 0.740 | 0.260 | 0.932 | 0.000 | 0.068 | 1.008 | 0.60 | 0.32 |
| Example 34 | 0.740 | 0.260 | 0.922 | 0.010 | 0.068 | 1.008 | 0.02 | 0.32 |
| Comparative Example 1 | 0.900 | 0.100 | 1.000 | 0.000 | 0.000 | 1.000 | 0.24 | 0.00 |
| Comparative Example 2 | 0.925 | 0.075 | 0.850 | 0.000 | 0.150 | 1.000 | 0.00 | 0.00 |
| Comparative Example 3 | 0.860 | 0.140 | 0.909 | 0.050 | 0.041 | 1.005 | 0.15 | 0.00 |
| Comparative Example 4 | 0.850 | 0.150 | 0.955 | 0.000 | 0.045 | 0.995 | 0.20 | 0.12 |
| Comparative Example 5 | 0.860 | 0.140 | 0.936 | 0.010 | 0.054 | 1.005 | 2.00 | 0.22 |
| Comparative Example 6 | 0.860 | 0.140 | 0.936 | 0.010 | 0.054 | 1.010 | 0.00 | 1.20 |
| Comparative Example 7 | 0.860 | 0.140 | 0.936 | 0.010 | 0.054 | 1.040 | 0.50 | 0.40 |
| Comparative Example 8 | 0.700 | 0.300 | 0.949 | 0.010 | 0.041 | 1.000 | 0.50 | 0.00 |
| Comparative Example 9 | 0.700 | 0.300 | 0.939 | 0.020 | 0.041 | 1.000 | 0.50 | 0.00 |
| Comparative Example 10 | 0.700 | 0.300 | 0.959 | 0.000 | 0.041 | 1.000 | 0.50 | 0.00 |

Next, piezoelectric elements according to embodiments of the present invention were prepared.

Preparation of Piezoelectric Element and Evaluation of Properties

Piezoelectric Elements of Examples 1 to 34

Piezoelectric elements were prepared by using the piezoelectric materials of Examples 1 to 34.

A gold electrode having a thickness of 400 nm was formed on both sides of the above-described disk-shaped ceramic by a DC sputtering method. A titanium film having a thickness of 30 nm and functioning as an adhesive layer was deposited between the electrode and the ceramic. The ceramic with the electrodes was cut to prepare a strip-shaped piezoelectric element having dimensions of 10 mm×2.5 mm×0.5 mm.

The temperature of a surface of a hot plate was set to 60° C. to 150° C. The piezoelectric element was placed on the surface of the hot plate, and an electric field of 1.4 kV/mm was applied to the piezoelectric element for 30 minutes. Thus, a polarization treatment was conducted.

Regarding the properties of a piezoelectric element including a piezoelectric material according to an embodiment of the present invention or a piezoelectric material corresponding to a Comparative Example, the $T_{to}$, the Curie temperature, the piezoelectric constant $d_{31}$, the mechanical quality factor (Qm), and the resistivity R of the piezoelectric element after the polarization treatment were evaluated. The results are shown in Table 4.

The $T_{to}$ and the Curie temperature in Table 4 were determined by measuring the dielectric constant under application of a very small AC electric field having a frequency of 1 kHz and a voltage of 0.5 V while varying the measurement temperature from −60° C. to 140° C., and determining a temperature at which the dielectric constant was maximal. The piezoelectric constant $d_{31}$ and the mechanical quality factor Qm were determined by a resonance-antiresonance method and the absolute values thereof are shown in Table 4. The resistivity R was determined by a resistivity measured under application of a DC voltage of 10 V.

TABLE 4

| | $T_{to}$ [° C.] | Curie temperature [° C.] | Piezoelectric constant $|d_{31}|$ [pm/V] | Mechanical quality factor Qm | Direct-current resistance R [GΩ · cm] |
|---|---|---|---|---|---|
| Example 1 | −26 | 111 | 82 | 1,100 | 340 |
| Example 2 | −28 | 111 | 80 | 1,130 | 300 |
| Example 3 | −26 | 111 | 84 | 960 | 1,050 |
| Example 4 | −30 | 113 | 81 | 1,150 | 520 |
| Example 5 | −24 | 105 | 90 | 1,020 | 530 |
| Example 7 | −46 | 105 | 68 | 1,210 | 740 |
| Example 8 | −30 | 109 | 79 | 1,160 | 360 |
| Example 9 | −34 | 109 | 77 | 1,140 | 340 |
| Example 10 | −38 | 105 | 74 | 1,180 | 980 |
| Example 11 | −42 | 105 | 71 | 1,190 | 1,150 |
| Example 12 | −20 | 108 | 85 | 1,120 | 320 |
| Example 13 | −18 | 108 | 83 | 1,150 | 280 |
| Example 14 | −22 | 108 | 87 | 980 | 1,030 |
| Example 15 | −25 | 110 | 84 | 1,170 | 530 |
| Example 16 | −20 | 102 | 93 | 1,040 | 510 |
| Example 18 | −40 | 102 | 71 | 1,230 | 710 |
| Example 19 | −26 | 106 | 82 | 1,180 | 350 |
| Example 20 | −30 | 106 | 80 | 1,160 | 330 |
| Example 21 | −32 | 102 | 77 | 1,200 | 960 |
| Example 22 | −36 | 102 | 74 | 1,210 | 1,140 |
| Example 23 | −32 | 114 | 79 | 1,080 | 330 |
| Example 24 | −36 | 114 | 77 | 1,110 | 271 |
| Example 25 | −34 | 114 | 81 | 940 | 1,050 |
| Example 26 | −34 | 116 | 78 | 1,130 | 550 |
| Example 27 | −24 | 108 | 87 | 1,000 | 530 |
| Example 29 | −50 | 108 | 65 | 1,190 | 690 |
| Example 30 | −34 | 112 | 76 | 1,140 | 360 |
| Example 31 | −38 | 112 | 74 | 1,120 | 340 |
| Example 32 | −42 | 108 | 71 | 1,160 | 960 |
| Example 33 | −44 | 108 | 68 | 1,170 | 1,110 |
| Example 34 | −42 | 105 | 68 | 1,020 | 350 |
| Comparative Example 1 | −50 | 128 | 35 | 1,090 | 980 |
| Comparative Example 2 | 20 | 80 | 141 | 80 | 50 |
| Comparative Example 3 | −40 | 90 | 110 | 770 | 100 |
| Comparative Example 4 | −44 | 116 | Evaluation could not be conducted | Evaluation could not be conducted | Evaluation could not be conducted |
| Comparative Example 5 | −30 | 111 | 41 | 1,150 | 1,200 |
| Comparative Example 6 | −28 | 111 | 40 | 1,400 | 70 |
| Comparative Example 7 | −30 | 111 | 43 | 1,210 | 800 |
| Comparative Example 8 | −60 | 113 | 64 | 760 | 1,100 |
| Comparative Example 9 | −54 | 110 | 67 | 780 | 1,120 |
| Comparative Example 10 | −64 | 116 | 61 | 740 | 1,140 |

All samples of Examples had a $T_{to}$ of lower than −18° C., but the piezoelectric constant, the mechanical quality factor, and the direct-current resistance were good.

Even when the gold electrodes were changed to electrodes formed by baking a silver paste, the properties equivalent to those of piezoelectric elements having the gold electrodes were obtained in all Examples.

Piezoelectric Elements of Comparative Examples 1 to 10

Piezoelectric properties were evaluated using the ceramics of Comparative Examples 1 to 10 as in Examples 1 to 34. The results are shown in Table 4.

Since the ceramic of Comparative Example 1 did not contain Zr, the piezoelectric constant $d_{31}$ was low, though the mechanical quality factor Qm was good. This composition is one disclosed in Japanese Patent Laid-Open No. 2010-120835.

In the ceramic of Comparative Example 2, although the piezoelectric constant $d_{31}$ was good, the resistivity was low. This composition is one disclosed in Japanese Patent Laid-Open No. 2009-215111.

Since the ceramic of Comparative Example 3 contained 5% by mole of Sn, the Curie temperature was low, that is, 90° C.

The ceramic of Comparative Example 4 had large crystal grains and was broken in the processing step. Thus, the electrical properties could not be evaluated.

Since the ceramic of Comparative Example 5 had a high content of Cu, that is, 2.00 parts by weight of Cu, the piezoelectric constant $d_{31}$ was low.

Since the ceramic of Comparative Example 6 did not contain Cu, the resistivity was low.

Since the ceramic of Comparative Example 7 had a large value of a, the density was low and the piezoelectric constant $d_{31}$ was low. Since the ceramics of Comparative Examples 8 to 10 did not contain Mn, the mechanical quality factor Qm was low, that is, less than 800.

Evaluation of Dynamic Characteristics of Piezoelectric Element

Subsequently, dynamic characteristics of a piezoelectric element including a piezoelectric material according to an embodiment of the present invention or a piezoelectric material corresponding to a Comparative Example were evaluated. Specifically, the power consumption when an alternating voltage was applied under the conditions described below was measured.

An alternating voltage (10 $V_{p-p}$) having a frequency near the resonance frequency (190 to 250 kHz) was applied to a strip-shaped device, and the relationship between the vibration speed and the power consumption of the device was evaluated. The vibration speed was measured with a laser Doppler vibrometer and the power consumption was measured with an electric power meter. Table 5 shows the power consumption measured when the vibration speed was adjusted to 0.40 m/s by changing the frequency.

TABLE 5

|  | Mechanical quality factor Qm | (Ba + Ca)/ (Ti + Zr + Sn + Mn) | Power consumption [mW] |
| --- | --- | --- | --- |
| Example 1 | 1,100 | 0.997 | 8 |
| Example 2 | 1,130 | 0.997 | 7 |
| Example 3 | 960 | 0.996 | 9 |
| Example 4 | 1,150 | 0.997 | 8 |
| Example 5 | 1,020 | 0.996 | 9 |
| Example 7 | 1,210 | 0.995 | 7 |
| Example 8 | 1,160 | 0.997 | 8 |
| Example 9 | 1,140 | 0.996 | 9 |
| Example 10 | 1,180 | 0.997 | 8 |
| Example 11 | 1,190 | 0.996 | 8 |
| Comparative Example 2 | 80 | 1.000 | Evaluation could not be conducted |
| Comparative Example 8 | 760 | 1.000 | 19 |

All devices of Examples had a power consumption of 20 mW or less, and satisfactory characteristics were obtained. In contrast, since the ceramic of Comparative Example 2 had a small mechanical quality factor and the vibration speed did not reach 0.4 m/s, evaluation could not be conducted.

Referring to the molar ratio (Ba+Ca)/(Ti+Zr+Sn+Mn) of the devices of Examples, when this value was in the range of 0.995 to 0.997, the power consumption became less than 10 mW and the devices had better dynamic characteristics.

Evaluation of Durability of Piezoelectric Element

In order to examine the durability of piezoelectric elements, a cycle test was conducted in which a temperature cycle of 25° C.→20° C.→50° C.→25° C. was repeated 100 times. The piezoelectric constants $d_{31}$ before and after the cycle test were evaluated. The rate of change in piezoelectric constant is shown in Table 6.

TABLE 6

|  | $T_{to}$ [° C.] | Piezoelectric constant before test $|d_{31}|$ [pm/V] | Piezoelectric constant after test $|d_{31}|$ [pm/V] | Rate of change |
| --- | --- | --- | --- | --- |
| Example 1 | −26 | 82 | 78 | −4.9% |
| Example 2 | −28 | 80 | 77 | −3.8% |
| Example 3 | −26 | 84 | 80 | −4.8% |
| Example 4 | −30 | 81 | 78 | −3.7% |
| Example 5 | −24 | 90 | 84 | −6.7% |
| Example 7 | −46 | 68 | 66 | −2.9% |
| Example 8 | −30 | 79 | 76 | −3.8% |
| Example 9 | −34 | 77 | 74 | −3.9% |
| Example 10 | −38 | 74 | 72 | −2.7% |

TABLE 6-continued

|  | $T_{to}$ [° C.] | Piezoelectric constant before test $|d_{31}|$ [pm/V] | Piezoelectric constant after test $|d_{31}|$ [pm/V] | Rate of change |
| --- | --- | --- | --- | --- |
| Example 11 | −42 | 71 | 70 | −1.4% |
| Comparative Example 2 | 20 | 141 | 91 | −35.5% |
| Comparative Example 8 | −60 | 64 | 63 | −1.6% |

Whereas the rate of change in piezoelectric property was 7% or less in all samples of Examples, a significant change of 35.5% occurred in Comparative Example 2. It is believed that degradation in polarization did not significantly occur with respect to the temperature change from −25° C. to 50° C. In contrast, the ceramic of Comparative Example 2 had a phase transition temperature of 20° C. Accordingly, it is believed that when the sample repeatedly passed the phase transition temperature in a reciprocating manner, degradation in polarization significantly occurred, resulting in the decrease in the piezoelectric property. That is, the ceramic of the Comparative Example 2 has insufficient durability of a device.

Preparation and Evaluation of Multilayered Piezoelectric Element

A multilayered piezoelectric element according to an embodiment of the present invention was prepared.

Example 35

Raw materials corresponding to a composition $((Ba_{0.875}Ca_{0.125})_{1.000}(Ti_{0.926}Sn_{0.02}Zr_{0.054})O_3)$ that is obtained by substituting x=0.125, y=0.02, z=0.054, and a=1.000 into a general formula represented by $(Ba_{1-x}Ca_x)_a(Ti_{1-y-z}Sn_yZr_z)O_3$ were weighed in a manner described below.

Barium carbonate, calcium carbonate, titanium oxide, tin oxide, and zirconium oxide were weighed as raw materials of a main component such that Ba, Ca, Ti, Sn, and Zr had the ratio of the above composition $((Ba_{0.875}Ca_{0.125})_{1.000}(Ti_{0.926}Sn_{0.02}Zr_{0.054})O_3)$.

To the weighed powders, 0.16 parts by weight of copper oxide (CuO) on a copper metal basis, 0.18 parts by weight of trimanganese tetraoxide ($Mn_3O_4$) on a manganese metal basis, and 3 parts by weight of a PVB binder were added and mixed. The resulting mixed liquid was formed into a sheet by a doctor blade method to prepare a green sheet having a thickness of 50 μm.

A conductive paste for forming an internal electrode was applied onto the green sheet by printing. A Ni paste was used as the conductive paste. Nine green sheets onto which the conductive paste was applied were stacked and the resulting stacked body was thermally press-bonded.

The thermally press-bonded stacked body was fired in a tubular furnace. Firing was conducted in air up to 300° C. to remove the binder, the atmosphere was then changed to a reducing atmosphere ($H_2$:$N_2$=2:98, oxygen concentration: $2 \times 10^{-6}$ Pa), and the temperature was maintained at 1,380° C. for five hours. In the temperature-decreasing process, the oxygen concentration was changed to 30 Pa from 1,000° C. and lower, and cooling was conducted to room temperature.

A sintered body obtained as described above was cut to a size of 10 mm×2.5 mm. The side surfaces of the resulting sample were polished. A pair of external electrodes (first and second electrodes) that alternately short-circuit the internal electrodes were formed on the side surfaces by Au sputtering. As a result, a multilayered piezoelectric element as shown in FIG. 2B was prepared.

The internal electrodes of the multilayered piezoelectric element were observed. Layers of nickel (Ni), which is an electrode material, and the piezoelectric material layers were alternately formed. The temperature of a surface of a hot plate was set to 60° C. to 100° C. The multilayered piezoelectric element was placed on the surface of the hot plate, and an electric field of 1 kV/mm was applied to the multilayered piezoelectric element for 30 minutes. Thus, a polarization treatment was conducted.

The piezoelectric properties of the multilayered piezoelectric element were evaluated. The multilayered piezoelectric element had a sufficient insulation property and good piezoelectric properties equivalent to those of the piezoelectric element of Example 1.

Production and Evaluation of Device
Liquid Ejection Head Including Piezoelectric Element of Example 1

A liquid ejection head shown in FIGS. 3A and 3B was produced by using a piezoelectric element of Example 1. Ejection of ink in response to an input electrical signal was confirmed.

Liquid Ejection Apparatus that Includes Liquid Ejection Head Including Piezoelectric Element of Example 1

A liquid ejection apparatus shown in FIG. 4 was produced by using a liquid ejection head shown in FIGS. 3A and 3B including a piezoelectric element of Example 1. Ejection of ink in response to an input electrical signal was confirmed on a recording medium.

Liquid Ejection Head Including Multilayered Piezoelectric Element of Example 35

A liquid ejection head shown in FIGS. 3A and 3B was produced by using a multilayered piezoelectric element of Example 35. Ejection of ink in response to an input electrical signal was confirmed.

Liquid Ejection Apparatus That Includes Liquid Ejection Head Including Multilayered Piezoelectric Element of Example 35

A liquid ejection apparatus shown in FIG. 4 was produced by using a liquid ejection head shown in FIGS. 3A and 3B including a multilayered piezoelectric element of Example 35. Ejection of ink in response to an input electrical signal was confirmed on a transfer member.

Ultrasonic Motor Including Piezoelectric Element of Example 11

An ultrasonic motor shown in FIG. 6A was produced by using a piezoelectric element of Example 11. Rotation of the motor in response to application of an alternating voltage was confirmed.

Lens Barrel Using Ultrasonic Motor Including Piezoelectric Element of Example 11

An optical apparatus shown in FIG. 8 was produced by using an ultrasonic motor that uses a piezoelectric element of Example 11. An automatic focusing operation in response to application of an alternating voltage was confirmed.

Ultrasonic Motor Including Multilayered Piezoelectric Element of Example 35

An ultrasonic motor shown in FIG. 6B was produced by using a multilayered piezoelectric element of Example 35. Rotation of the motor in response to application of an alternating voltage was confirmed.

Dust Removing Device that is Example of Vibration Apparatus Including Piezoelectric Element of Example 11

A dust removing device shown in FIGS. 9A and 9B was produced by using a piezoelectric element of Example 11. Plastic beads were dispersed, and an alternating voltage was applied. As a result, satisfactory removal of dust was confirmed.

Dust Removing Device that is Example of Vibration Apparatus Including Multilayered Piezoelectric Element of Example 35

A dust removing device shown in FIGS. 9A and 9B was produced by using a multilayered piezoelectric element of Example 35. Plastic beads were dispersed, and an alternating voltage was applied. As a result, satisfactory removal of dust was confirmed.

Image Pickup Device that Includes Dust Removing Device Including Piezoelectric Element of Example 11

An image pickup device shown in FIG. 13 was produced by using an image pickup element unit and a dust removing device including a piezoelectric element of Example 11. When the image pickup device was operated, dust adhering to a surface of the image pickup element unit was satisfactorily removed and an image free of dust defects was obtained.

Electronic Apparatus Using Piezoelectric Acoustic Component Including Piezoelectric Element of Example 11

An electronic apparatus shown in FIG. 14 was produced by using a piezoelectric acoustic component including a piezoelectric element of Example 11. The operation of the speaker in response to application of an alternating voltage was confirmed.

The piezoelectric material according to an embodiment of the present invention has a good, stable piezoelectric constant and a good, stable mechanical quality factor in a wide operating temperature range. Furthermore, since the piezoelectric material does not contain lead, the piezoelectric material has a low environmental load. Accordingly, the piezoelectric material according to an embodiment of the present invention can be used without problems even in apparatuses in which a large amount of piezoelectric material is used, such as a liquid ejection head, a liquid ejection apparatus, an ultrasonic motor, an optical apparatus, a vibration apparatus, a dust removing device, an image pickup device, and an electronic apparatus.

According to the present invention, a lead-free piezoelectric material that has a good, stable piezoelectric constant and a good, stable mechanical quality factor in a wide operating temperature range. Furthermore, the present invention can provide a piezoelectric element, a multilayered piezoelectric element, a liquid ejection head, a liquid ejection apparatus, an ultrasonic motor, an optical apparatus, a vibration apparatus, a dust removing device, an image pickup device, and an electronic apparatus, all of which use the lead-free piezoelectric material.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-287242 filed Dec. 28, 2012, which is hereby incorporated by reference herein in its entirety.

What is claimed is:
1. A piezoelectric material comprising:
a perovskite-type metal oxide represented by general formula (1),

$$(Ba_{1-x}Ca_x)_a(Ti_{1-y-z}Sn_yZr_z)O_3 \quad (1),$$

copper (Cu), and
manganese (Mn), where 1.00≤a≤1.01, 0.125≤x≤0.300, 0≤y≤0.020, and 0.041≤z≤0.074,
wherein a Cu content relative to 100 parts by weight of the metal oxide is 0.02 parts by weight or more and 0.60 parts by weight or less on a metal basis, and
a Mn content relative to 100 parts by weight of the metal oxide is 0.12 parts by weight or more and 0.40 parts by weight or less on a metal basis.

2. The piezoelectric material according to claim 1, wherein, in general formula (1), the relationship y+z≤(11x/14)−0.037 is satisfied.

3. The piezoelectric material according to claim 2, wherein, in general formula (1), the relationship z≤−2y+0.100 is satisfied.

4. The piezoelectric material according to claim 3, wherein the piezoelectric material has a relative density of 93% or more and 100% or less.

5. A piezoelectric element comprising:
a first electrode;
a piezoelectric material portion; and
a second electrode,
wherein the piezoelectric material portion comprises the piezoelectric material according to claim 1.

6. A multilayered piezoelectric element comprising:
piezoelectric material layers; and
electrode layers including an internal electrode,
wherein the piezoelectric material layers and the electrode layers are alternately stacked, and
the piezoelectric material layers comprise the piezoelectric material according to claim 1.

7. The multilayered piezoelectric element according to claim 6,
wherein the internal electrode contains Ag and Pd, and
a weight ratio M1/M2 of a Ag content M1 by weight to a Pd content M2 by weight satisfies the relationship 0.25≤M1/M2≤4.0.

8. The multilayered piezoelectric element according to claim 6, wherein the internal electrode contains at least one of Ni and Cu.

9. A liquid ejection head comprising:
a liquid chamber including a vibration unit that includes the piezoelectric element according to claim 5; and
an ejection port in communication with the liquid chamber.

10. A liquid ejection apparatus comprising:
a placing unit of a transfer member; and
the liquid ejection head according to claim 9.

11. An ultrasonic motor comprising:
a vibrating member that includes the piezoelectric element according to claim 5; and
a moving member that contacts the vibrating member.

12. An optical apparatus comprising:
a driving unit including the ultrasonic motor according to claim 11.

13. A vibration apparatus comprising:
a vibrating member including
a diaphragm, and
the piezoelectric element according to claim 5 disposed on the diaphragm.

14. A dust removing device comprising:
a vibration unit including the vibration apparatus according to claim 13.

15. An image pickup device comprising:
the dust removing device according to claim 14; and
an image pickup element unit,
wherein a diaphragm of the dust removing device is disposed on a light-receiving surface side of the image pickup element unit.

16. An electronic apparatus comprising:
a piezoelectric acoustic component including the piezoelectric element according to claim 5.

17. A liquid ejection head comprising:
a liquid chamber including a vibration unit that includes the multilayered piezoelectric element according to claims 6; and
an ejection port in communication with the liquid chamber.

18. A liquid ejection apparatus comprising:
a placing unit of a transfer member; and
the liquid ejection head according to claim 17.

19. An ultrasonic motor comprising:
a vibrating member that includes the multilayered piezoelectric element according to claim 6; and
a moving member that contacts the vibrating member.

20. An optical apparatus comprising:
a driving unit including the ultrasonic motor according to claim 19.

21. A vibration apparatus comprising:
a vibrating member including
a diaphragm, and
the multilayered piezoelectric element according to claim 6 disposed on the diaphragm.

22. A dust removing device comprising:
a vibration unit including the vibration apparatus according to claim 21.

23. An image pickup device comprising:
the dust removing device according to claim 22; and
an image pickup element unit,
wherein a diaphragm of the dust removing device is disposed on a light-receiving surface side of the image pickup element unit.

24. An electronic apparatus comprising:
a piezoelectric acoustic component including the multilayered piezoelectric element according to claim 6.

25. A piezoelectric material comprising:
an oxide containing Ba, Ca, Ti, Sn, Zr, Cu, and Mn; or
an oxide containing Ba, Ca, Ti, Zr, Cu, and Mn,
wherein x that is a ratio of a Ca content (mol) to a sum of a Ba content and the Ca content (mol) satisfies 0.125≤x≤0.300,
wherein y that is a ratio of a Sn content (mol) to a sum of a Ti content, the Sn content, and a Zr content (mol) satisfies 0≤y≤0.020,
wherein z that is a ratio of the Zr content (mol) to the sum of the Ti content, the Sn content, and the Zr content (mol) satisfies 0.041≤z≤0.074,
wherein the Cu content (parts by weight) relative to 100 parts by weight of the oxide containing Ba, Ca, Ti, Sn, Zr, Cu, and Mn, or the Cu content (parts by weight) relative to 100 parts by weight of the oxide containing Ba, Ca, Ti, Zr, Cu, and Mn is 0.02 parts by weight or more and 0.60 parts by weight or less, and
wherein the Mn content (parts by weight) relative to 100 parts by weight of the oxide containing Ba, Ca, Ti, Sn, Zr, Cu, and Mn, or the Mn content (parts by weight) relative to 100 parts by weight of the oxide containing Ba, Ca, Ti, Zr, Cu, and Mn is 0.12 parts by weight or more and 0.40 parts by weight or less.

26. A piezoelectric element comprising:
a first electrode;
a piezoelectric material portion; and
a second electrode,
wherein the piezoelectric material portion comprises the piezoelectric material according to claim 25.

27. A multilayered piezoelectric element comprising:
piezoelectric material layers; and
electrode layers including an internal electrode,
wherein the piezoelectric material layers and the electrode layers are alternately stacked, and
the piezoelectric material layers comprise the piezoelectric material according to claim 25.

28. An electronic apparatus comprising the piezoelectric element according to claim 26.

29. An electronic apparatus comprising the multilayered piezoelectric element according to claim 27.

* * * * *